(12) United States Patent
Matsuoka et al.

(10) Patent No.: US 6,831,316 B1
(45) Date of Patent: Dec. 14, 2004

(54) SEMICONDUCTOR MEMORY DEVICE AND METHOD OF MANUFACTURING THE SAME

(75) Inventors: Hideyuki Matsuoka, Nishi-Tokyo (JP); Takeshi Sakata, Hino (JP); Shinichiro Kimura, Kunitachi (JP); Toshiaki Yamanaka, Iruma (JP); Tsuyoshi Kachi, Kokubunji (JP); Tomonori Sekiguchi, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 57 days.

(21) Appl. No.: 10/009,826
(22) PCT Filed: Jun. 8, 2000
(86) PCT No.: PCT/JP00/03723

§ 371 (c)(1),
(2), (4) Date: Mar. 19, 2002

(87) PCT Pub. No.: WO00/79597

PCT Pub. Date: Dec. 28, 2000

(30) Foreign Application Priority Data

Jun. 17, 1999 (JP) .......................................... 11/171557

(51) Int. Cl.⁷ ....................... H01L 47/00; H01L 27/108; H01L 29/76; H01L 29/94; H01L 31/119
(52) U.S. Cl. ........................................... 257/296; 257/2
(58) Field of Search ............................ 257/2, 295–310, 257/314–324, 410–412; 438/257–264, 3

(56) References Cited

U.S. PATENT DOCUMENTS

| | | | |
|---|---|---|---|
| 3,979,613 A | * | 9/1976 | Kroger et al. .............. 257/411 |
| 5,483,482 A | | 1/1996 | Yamada et al. ............. 365/175 |
| 5,535,156 A | | 7/1996 | Levy et al. .................. 365/175 |
| 5,665,978 A | | 9/1997 | Uenoyama et al. ........... 257/30 |
| 5,684,737 A | | 11/1997 | Wang et al. ................. 365/175 |
| 5,745,407 A | | 4/1998 | Levy et al. .................. 365/159 |
| 5,904,518 A | * | 5/1999 | Komori et al. ............. 438/258 |
| 6,034,882 A | * | 3/2000 | Johnson et al. ............. 365/103 |

FOREIGN PATENT DOCUMENTS

| JP | 10-125939 | 5/1998 |
|---|---|---|
| JP | 11-17184 | 1/1999 |

* cited by examiner

*Primary Examiner*—Cuong Nguyen
(74) *Attorney, Agent, or Firm*—Miles & Stockbridge P.C.

(57) ABSTRACT

An existent DRAM memory cell comprises transistors as a switch and capacitors for accumulating storage charges in which the height of the capacitor has been increased more and more along with micro miniaturization, which directly leads to increase in the manufacturing cost. The invention of the present application provides a semiconductor memory device of a basic constitution in which a memory cell array having plural memory cells disposed on a semiconductor substrate and word lines and data lines for selecting the memory cells and a peripheral circuit at the periphery of the memory cell array wherein the memory cell comprises a multi-layer of a conductive layer, an insulating layer and plural semiconductor layers containing impurities, and a potential can be applied to the insulating layer enabling the tunneling effect. The invention of the present application concerns a memory cell not requiring capacitor and capable of being formed in simple steps.

33 Claims, 26 Drawing Sheets

(a)

(b)

(c)

(a)

(b)

SEMICONDUCTOR MEMORY DEVICE AND METHOD OF MANUFACTURING THE SAME

TECHNICAL FIELD

The present invention relates to a semiconductor memory device and a manufacturing method thereof.

BACKGROUND ART

Heretofore, demand for dynamic random access memories (DRAM) that has attained improvement for integration at a rate of four times per three year, has been increased more and more along with an explosive increase in the sales sum of personal computers in recent years. Already, mass production for 16 Mbits has passed the peak and development has been progressed at present for the mass production of 64 Mbits using a size of 0.2 µm or less as the micro-fabrication in the next generation.

The memory cell for DRAM from 16 Kb to those put into products at present is constituted with a transistor 50 as a switch and a capacitor 51 for accumulating storage charges. Such a memory cell is referred to as 1 transistor cell. In the memory cell, the signal voltage read to data line BL is determined depending on the ratio of the capacitance Cs to the capacitor voltage 51 and the parasitic capacitance Cd of the data line BL. Further, since the signal voltage of the memory cell is charged to the voltage for the data line by reading the information, it is destructive reading. Accordingly, the memory cell of this type requires a refreshing operation of rewriting the data. WL in the figure shows a word line.

One of the greatest-subjects in the memory cell is insurance of necessary and sufficient capacitance Cs of the capacitor with two view points of the signal voltage of the memory cell and the durability to the soft errors. In order to solve the subject, the memory cell is constituted as a three dimensional structure and the height for the capacitor has been increased more and more along with microminiaturization in order to ensure necessary and sufficient accumulation capacitance. FIG. 2 shows an example of such a memory cell. FIG. 2 shows a cross section for a portion of a memory array 60 and a peripheral circuit 61. As described above, the height of the memory cell is increased for ensuring the capacitance thereof. In the example shown in FIG. 2, the capacitor 63 is mounted on a semiconductor substrate 77 disposed with a switching transistor 50. The capacitor has a lower electrode 73, an insulating layer 74, and an upper electrode 75. Since the capacitor is mounted on the semiconductor substrate, the height inevitably increases in order to ensure a desired capacitance for the capacitor. An example of such a memory cell is seen, for example, in FIG. 1 of 1999, IEDM, pp 45–48.

However, increase for the height of the capacitor results in large height difference between the memory array 60 and the peripheral circuit 61. This remarkably reduces the margin for various designs to the process including lithography. This directly leads to the increase of the manufacturing cost. It is inevitable that the problem will become severer in DRAM after 256 Mbits. In view of the background described above, it has been highly expected for a memory cell not requiring capacitor instead of the existent 1 transistor cell. As described above, it is anticipated a considerable difficulty for the attainment of DRAM after 256 Mbits of memory capacitance with the existent 1 transistor cell in view of a physical reason because of the increasing height of the capacitor.

Further, while an example of using a device that utilizes a multistable current state to a memory cell has also been reported, it has not yet been put to practical use at present. Such an example is described, for example, in U.S. Pat. Nos. 5,745,407 and 5,535,156.

The invention of the present application intends to drastically turn such current background.

DISCLOSURE OF INVENTION

In order to solve such problems, the invention of the present application provides a semiconductor memory device using a bistable diode not requiring a capacitor as a constituent element of the memory cell instead of the existent 1 transistor cell, as well as a manufacturing method thereof.

According to the invention of the present application, the cell area in semiconductor memory device is extremely small to enable high integration degree. Further, according to the invention of the present application, it can provide a semiconductor memory device requiring no refreshing and suitable to embedding with logics, as well as a manufacturing method thereof. More specifically, the invention of the present application can provide a random access memory (RAM) with extremely small memory cell area and capable of attaining high integration degree.

At first, for easy understanding, a basic concept of the invention of the present application is to be explained with reference to the drawings.

A bistable diode that can be used in the invention of the present application is a negative resistance element having at least a high impedance state and a low impedance state.

A specific structure in a typical example of a bistable diode that can be used in the invention of the present application has a basic structure as shown in FIG. 3A. That is, the basic structure thereof comprises a multi-layered structure of a conductive layer (1)/insulating layer (2)/n-type semiconductor layer (3)/p-type semiconductor layer (4). Substantially the same discussion can be applied also to a structure in which the order of layering is replaced between the n-type semiconductor (3) and the p-type semiconductor (4) excepting that the polarity is inverted. Typical examples of the n-type semiconductor layer (3) and the p-type semiconductor (4) are n-type silicon layer and p-type silicon layer, respectively. Accordingly, the n-type semiconductor layer (3) and the p-type semiconductor layer (4) are to be explained with silicon layers respectively. Further, the insulating layer can be constituted with plural insulating layers. This example is to be described later.

Now, in the structure shown in FIG. 3(*a*), a positive bias is applied to the p-type silicon 3. At the initial stage, an n-type silicon band is bent at the boundary of the insulating layer (2)/n-type silicon layer (3). However, since holes are not accumulated at the boundary thereof in this case, a depletion layer 5 is formed on the surface of semiconductor crystals. FIG. 3(*b*) is a band-structural view showing the state. The state in FIG. 3(*b*) shows a so-called deep depression state. As a result, most of the application voltage is applied to the surface depletion layer formed in the boundary of the insulator (2)/n-type silicon (3). Accordingly, since the voltage applied on the insulating layer (2) is weak, movement of the carriers by way of the insulating layer, for example, tunneling effect is inhibited. As a result, the memory cell is in a high impedance state. Reference numeral for each of the layers in FIG. 3(*b*) corresponds to the structure shown in FIG. 3(*a*). In the drawing, a small tunnel current 6 is shown by an arrow. Further, the state of the applied voltage to the insulating layer (2), so-called a tunnel film is depicted by reference numeral 9. The movement of carriers by way of the insulating layer is to be explained by means of movement by a so-called tunneling effect.

Further, when the voltage applied to the p-type silicon is increased, hole current from a PN-junction 7 formed in the inside of the substrate increases to form an inversion layer 8 at the boundary of the insulator (2)/n-type silicon (3). Accordingly, most of the application voltage is applied to the insulating layer (2). As a result, tunneling of electrons from the conductor (1) is enabled and since electrons injected from the conductor (1) neutralize donors of the n-type silicon layer (3), the barrier for the hole injection is further lowered and the current is further increased. Thus, the low impedance state of the memory cell is attained.

FIG. 3C shows a band structural view in this state. The reference numerals for each of the layers in FIG. 3(c) correspond to the structure in FIG. 3(a). In the figure, a large tunnel current 6 is depicted by a fat arrow.

As a result, the device shows a bistable state. Accordingly, when a load resistance is connected in series with the device exemplified in FIG. 3, there are present two stable points as shown in FIG. 4. Accordingly, a memory device can be constituted with such a constitution. FIG. 4 is a graph schematically showing operation characteristics of the device exemplified in FIG. 3 when a load resistance is connected in series therewith. In FIG. 4, the abscissa expresses voltage and the ordinate expresses current. All the unit are arbitrary units. FIG. 4 shows the characteristics in the high impedance state and the low impedance state described above and further shows a load line in a case of connecting a resistor. Then, FIG. 4 shows the two stable points described above as "H" and "L".

FIG. 5 is a constitutional example of a memory cell array using the bistable diode. As shown in FIG. 5, memory cells 100 can be arranged at the intersections of word lines WL1, WL2 and bit lines BL1 and BL2. The memory cell 100 is constituted as described above with a conductive layer, an insulating layer, an n-type silicon layer and a p-type silicon layer. Reference numeral 101 denotes a load resistance for the diode. The load resistance 101 is sometimes designed specifically by a so-called parasitic resistance in view of the constitution of the semiconductor device. Accordingly, it will be apparent that the load resistance 101 also includes the resistance thus disposed in the specification of the present application.

As will be described specifically in subsequent examples, according to the invention of the present application, a memory cell of a minimum area can be realized theoretically. That is, memory cells are usually arranged in a matrix in a semiconductor memory device. Then, since the structure of the memory cell used in the invention of the present application is constituted with the diode having the bistable characteristic and the load resistance described above, when the word lines and the bit lines are laid out perpendicular to each other in the semiconductor memory device, the memory cell can be mounted within a region where the word line and the bit line intersect to each other. Accordingly, the invention of the present application can provide a memory cell with the required minimum occupying area in principle. It will be apparent that the occupying area is smaller compared with that of the existent memory cells. Specifically, the size is about one-half of the existent 1 transistor memory cell. Further, the invention according to the present application can attain a semiconductor memory device having a memory element with less junction leak current and of excellent characteristics.

Principal modes of the invention according to the present application are set forth below.

(1) A first mode is a semiconductor memory device characterized by comprising a semiconductor substrate; a memory cell array, disposed on the semiconductor substrate, having plural memory cells, word lines and data lines for selecting the memory cells; and a peripheral circuit disposed on the semiconductor substrate; wherein the memory cell has a multi-layer of a conductive layer, an insulating layer and plural semiconductor layers containing impurities, and a potential can be applied to the insulating layer that enables the movement of carriers by way of the multi-layer.

Usually, the plural memory cells are arranged in a matrix manner.

(2) A second mode is a semiconductor memory device characterized by comprising a semiconductor substrate; a memory cell array, disposed on the semiconductor substrate, having plural memory cells, word lines and data lines for selecting the memory cells; and a peripheral circuit disposed on the semiconductor substrate on the periphery of the memory cell array; wherein the memory cell has a multi-layer of a conductive layer, an insulating layer and plural semiconductor layers containing impurities, and the multi-layer of the memory cell has bistable characteristics for the resistance value.

(3) A third mode is a semiconductor memory device characterized by comprising a semiconductor substrate; a memory cell array, disposed on the semiconductor substrate, having plural memory cells, word lines and data lines for selecting the memory cells; and a peripheral circuit, disposed on the semiconductor substrate, which is constituted with plural insulated gate field effect transistors (MISFET) on the periphery of the memory cell array; wherein the memory cell has a multi-layer of a conductive layer, an insulating layer that enables the tunneling effect and plural semiconductor layers containing impurities, and the semiconductor layers containing impurities are present in the semiconductor substrate.

In this case, it is extremely important that the plural semiconductor layers containing the impurities are present in the semiconductor substrate. The characteristics of the invention according to the present application can be attained extremely favorably. That is, the embodiment of the invention according to the present application can provide the structure of MISS (Metal Insulator Semiconductor Switch) with characteristics of higher performance. The plural semiconductor layers containing the impurities can be confined electrically within the semiconductor substrate.

(4) A fourth mode is a semiconductor memory device as defined in any one of the foregoing paragraphs (1) to (3), wherein the plural semiconductor layers containing impurities constituting the memory cell have at least two semiconductor layers of different p-type and n-type conduction. This mode is a more actual mode of plural semiconductor layers containing the impurities. This mode shows a most typical constitution of the invention according to the present application. As described above, the order of layering the p-type semiconductor layer and the n-type semiconductor layer may be optional. Further, the plural semiconductor layers containing the impurities can also be constituted with more semiconductor layers.

(5) A fifth mode is a semiconductor memory device as defined in the forgoing paragraph (4), wherein a position of junction formed of the two semiconductor layers of different p-type and n-type conduction of the memory cell is shallower than the depth of a device isolation region formed in the semiconductor substrate. Since the junction position of both between the P-type and N-type semiconductor regions is shallower than the depth of the device isolation region, both of the P-type and N-type semiconductor regions are defined by the insulation region of the device isolation region. Accordingly, this constitution can separate the memory cell in a self-aligned manner by utilizing the device isolation region.

(6) A sixth mode is a semiconductor memory device as defined in any one of the foregoing paragraphs (4) and (5) described above, wherein the position for the PN junction of the memory cell is shallower than the depth of 0.3 $\mu$m from the surface of the semiconductor substrate.

This mode shows practical and useful PN junction position in the field of the semiconductor device. In particular, this structure can define the position of the PN junction by the formation of the isolation insulating layer.

(7) A seventh mode is a semiconductor memory device as defined in any one of the foregoing paragraphs (4) to (6), wherein at least one of the plural semiconductor layers containing impurities for forming the memory cell has a impurity concentration that is higher in the inside of the semiconductor substrate than on the surface of the semiconductor substrate.

Since the concentration of the impurities at the PN junction is increased by the constitution, the width of the depression layer is more narrowed. Accordingly, punch through of the region including the depletion layer can be suppressed. On the other hand, the impurity concentration is set lower at the boundary constituted of the insulating layer and the semiconductor layer than that at the inside. Accordingly, the switching voltage of the device can be lowered. That is, low voltage operation of the devices is enabled.

The low voltage operation is a useful characteristic for constituting the memory array using NDR (Negative Differential Resistance) using this semiconductor device.

(8) An eighth mode is a semiconductor memory device as defined in any one of the forgoing paragraphs (4) to (7), wherein an impurity concentration of the layer present in contact with the surface of the semiconductor substrate among the plural semiconductor layers containing impurities for forming the memory cell is $1\times10^{17}$ cm$^{-3}$ or less on the surface of the semiconductor substrate.

This mode shows the practical and useful range of the impurities concentration in the field of the semiconductor device.

(9) A ninth mode is a semiconductor memory device as defined in any one of the foregoing paragraphs (4) to (8), wherein a maximum impurity concentration of a layer present in adjacent with the surface of the semiconductor substrate among the plural semiconductor layers containing impurities for forming the memory cell is $1\times10^{17}$ cm$^{-3}$ or more.

This mode shows the practical and useful range of the impurities concentration in the field of the semiconductor device.

(10) A tenth mode is a semiconductor memory device as defined in any one of the foregoing paragraphs (4) to (9), wherein a maximum impurity concentration of the layer present in the inside of the semiconductor substrate among the plural semiconductor layers containing impurities for forming the memory cell is $1\times10^{17}$ cm$^{-3}$ or more.

(11) An eleventh mode is a semiconductor memory device as defined in any one of the foregoing paragraphs (4) to (10), wherein a position of the PN junction of the memory cell is at a place deeper than a position at which an impurity concentration is maximum of a layer present in contact with the surface of the semiconductor substrate among the plural semiconductor layers containing impurities for forming the memory cell.

(12) A twelfth mode is a semiconductor memory device as defined in any one of the foregoing paragraphs (1) to (3), wherein the plural semiconductor layers containing impurities for forming the memory cell comprise two P-type layers putting an N-type layer therebetween, or two N-type layers putting a P-type layer therebetween.

(13) A thirteenth mode is a semiconductor memory device wherein two P-type layers and an N-type layer present apart from the surface of the semiconductor substrate among the three semiconductor layers containing impurities for forming the memory cell satisfy the conditions as defined in any one of the foregoing paragraphs (5) to (11).

Modes set forth below are extremely practical and useful embodiments when the memory cell according to the invention of the present application is incorporated as a semiconductor memory device. The concrete examples are to be explained in the columns of preferred embodiments.

(14) A fourteenth mode is a semiconductor memory device as defined in any one of the foregoing paragraphs (3) to (13), wherein the conductive layer of the memory cell is a conductive layer connected to a gate electrode of an insulate gate field effect transistor (MISFET) in the peripheral circuit.

(15) A fifteenth mode is a semiconductor memory device as defined in any one of the foregoing paragraphs (3) to (14), wherein the conductive layer of the memory cell comprises a multi-layer containing N-type or P-type polycrystal silicon.

(16) A sixteenth mode is a semiconductor memory device as defined in any one of the foregoing paragraphs (3) to (15), wherein the insulating layer of the memory cell is an insulating layer connected with an insulating layer of an insulated gate field effect transistor (MISFET) in the peripheral circuit.

(17) A seventeenth mode is a semiconductor memory device as defined in any one of the foregoing paragraphs (1) to (16), wherein the insulating layer of the memory cell is a multi-layer of insulating layers having different band gaps.

(18) An eighteenth mode is a semiconductor memory device as defined in the foregoing paragraph (17), wherein the insulating layer of the memory cell comprises a multi-layer of a silicon oxide layer and a silicon nitride layer and the silicon oxide layer is present in contact with a P-type semiconductor layer formed in the silicon substrate.

The following examples are useful examples upon manufacture of a semiconductor device having a memory array specifically.

(19) A nineteenth mode is a semiconductor memory device as defined in any one of the foregoing paragraphs (1) to (18), wherein at least one of plural semiconductor layers containing the impurities of the memory cell is present extending in a direction perpendicular to the word line in the semiconductor substrate.

(20) A twentieth mode is a semiconductor memory device as defined in any one of the foregoing paragraphs (1) to (19), wherein a layer in contact with the insulating layer for forming the memory cell among the plural semiconductor layers containing the impurities of the memory cell is present being separated for every memory cell.

(21) A twenty first mode is a semiconductor memory device as defined in any one of the foregoing paragraphs (1) to (20), wherein a conductive plug is electrically connected to a layer formed to the lowest portion among the plural semiconductor layers containing impurities for forming the memory cell.

In this example, the planer region for each of the devices can be kept small by the use of the conductive plug.

(22) A twenty second mode is a semiconductor memory device as defined in any one of the foregoing paragraphs (1) to (21), wherein a layer formed at the lowest portion among plural semiconductor layers containing impurities for forming the memory cell is electrically connected with a conductive layer extending in a direction perpendicular to the word lines in a planer arrangement.

(23) A twenty third mode is a semiconductor memory device as defined in any one of the foregoing paragraphs (1) to (22), wherein the layer present extending in a direction perpendicular to the word line in the planer arrangement among the plural semiconductor layers containing the impurities of the memory cell is electrically connected with one of diffusion layers of the insulated gate field effect transistor (MISFET) formed in the semiconductor substrate and connected electrically with the conductive layer extending in the direction perpendicular to the word line in the planer arrangement to the other of the diffusion layers of the MISFET.

(24) A twenty fourth mode is a semiconductor memory device characterized by including plural memory arrays each comprising plural word lines; plural data lines arranged so as to intersect the plural word lines in a planer arrangement; plural memory cells which are disposed each at a desired intersection between the plural word lines and the plural data lines and each connected to the corresponding word line and corresponding data line; a common data line disposed in common with the plural data lines; and plural signal transmission means having a switching function for connecting the common data line to the plural data lines respectively; wherein the memory cell has a multi-layer of a conductive layer, an insulating layer and a plural semiconductor layers containing impurities and a potential can be applied to the insulating layer that enables movement of the carriers by way of the multi-layer.

(25) A twenty fifth mode is semiconductor memory device characterized by including plural memory arrays each comprising plural word lines; plural data lines arranged so as to intersect the plural word lines in a planer arrangement; plural memory cells which are disposed each at a desired intersection between the plural word lines and the plural data lines and each connected to the corresponding word line and corresponding data line, a common data line disposed in common with the plural data lines; and plural signal transmission means having a switching function for connecting the common data line to the plural data lines respectively; wherein the memory cell has a multi-layer of a conductive layer, an insulating layer and a plural semiconductor layers containing impurities and the multi-layer of the memory cell has a bistable characteristic of a resistance value.

(26) A twenty sixth modes a semiconductor memory device characterized by including plural memory arrays each comprising plural word lines; plural data lines arranged so as to intersect the plural word lines in a planer arrangement; plural memory cells which are disposed each at a desired intersection between the plural word lines and the plural data lines and each connected to the corresponding word line and corresponding data line; a common data line disposed in common with the plural data lines; and plural signal transmission means having a switching function for connecting the common data line to the plural data lines respectively; wherein the memory cell has a multi-layer of a conductive layer, an insulating layer enabling a tunnel effect and a plural semiconductor layers containing impurities, and the plural semiconductor layers containing the impurities are present in the semiconductor substrate.

(27) A twenty seventh mode is a semiconductor device as defined in any one of the foregoing paragraphs (1) to (26), wherein at least a memory cell and, further, the memory device are formed on a silicon on insulator substrate.

(28) A twenty eighth mode is a semiconductor memory device as defined in any one of the foregoing paragraphs (1) to (27), wherein plural bit lines have one sense amplifier in common in the memory cell array region.

(29) A twenty ninth mode is a semiconductor device having a bistable diode in a semiconductor substrate.

In this mode, the bistable diode is constituted not being stacked on the semiconductor substrate but being contained in the semiconductor substrate. Among all, it is important that the semiconductor layer region of the bistable diode is formed in the semiconductor substrate. That is, a desired portion of the prepared semiconductor substrate is used at least as a portion of the semiconductor layer of the bistable diode. It is of course possible to use a desired portion of the prepared semiconductor substrate as all of various semiconductor layers of the bistable diode. This example is novel and can utilize the bistable diode with a sufficiently effective characteristic.

In the specification of the present application, it is apparent that the semiconductor substrate also includes the substrate prepared by disposing an epitaxial layer on a desired semiconductor substrate.

(30) A thirtieth mode is a semiconductor memory device wherein the semiconductor device or the semiconductor memory device according to the invention of the present application is such that the memory device is disposed in the semiconductor substrate and the memory capacity is 256 Mbits or more.

In this mode, the memory device is constituted not being stacked on the semiconductor substrate but being contained in the semiconductor substrate. This mode is novel and the memory device can be utilized with a sufficiently effective characteristic. Then, according to the constitution of the invention of the present application, a semiconductor memory device having a memory capacity of 256 Mbits or more can be constituted while effectively insuring the memory characteristic, the switching characteristic or the regulation for the device occupying area.

In the same manner as explained for the foregoing paragraph (29), the memory device is constituted not being stacked on the semiconductor substrate, but being contained in the semiconductor substrate. Among all, it is important that the semiconductor layer region of the memory device is formed in the semiconductor substrate. That is, a desired portion of the prepared semiconductor substrate is used at least as a portion of the semiconductor layer of the memory device. It is apparent that a desired portion of the prepared semiconductor substrate can be used as all of various semiconductor layers of the memory device.

The invention of the present application can at first provide a semiconductor memory device in which the memory device is disposed in the semiconductor substrate and the storage capacity is 256 Mbits or more.

(31) A thirty first mode is a method of manufacturing a semiconductor memory device comprising a step of forming device isolation regions for electrically isolating devices to a semiconductor substrate; a step of forming an impurity diffusion layer in the substrate by implantation of ions at high energy in a memory cell array region and then forming an insulating layer on the surface of the substrate; a step of forming a word electrode in the memory cell array region and a gate electrode of an insulated gate field effect transistor (MISFET) in a peripheral circuit region; a step of etching a silicon substrate using a region covering the word electrode as at least an area corresponding to a mask, and thereby isolating the memory array for every cell; a step of depositing an insulating interlayer, then opening a contact hole and burying a conductive body into the contact; and a step of forming a bit line in the memory cell array region and a local interconnect layer in the peripheral circuit region.

The concrete method thereof is to be explained in the column for preferred embodiments.

BEST MODE FOR CARRYING OUT THE INVENTION

Preferred embodiments according to the invention of the present application will be described specifically along with manufacturing steps.

The flow for the entire process is as described below. At first, a memory array and then an MOSFET used for a peripheral circuits are prepared and, finally, an interconnect layer is prepared in this order. In the present specification, the term MOSFET is used for generally describing a so-called gate insulated field effect transistor (MISFET). That is, this indicates that the insulating layer used for providing the field effect of the transistor is not restricted only to typical oxide layers, among all, silicon oxide.

<Embodiment 1>

At first, an actual process flow for Embodiment 1 is to be described.

Figure 1:
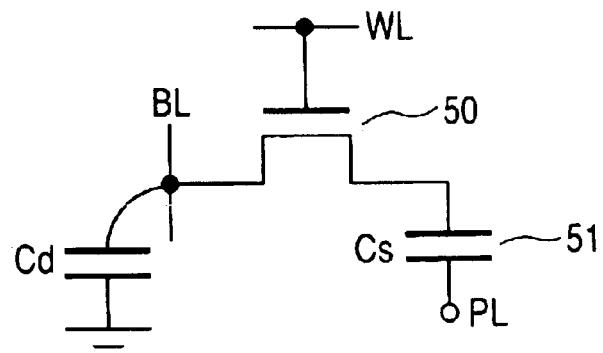
FIG. 1 is an equivalent circuit of an existent 1 transistor memory cell.
Figure 2:
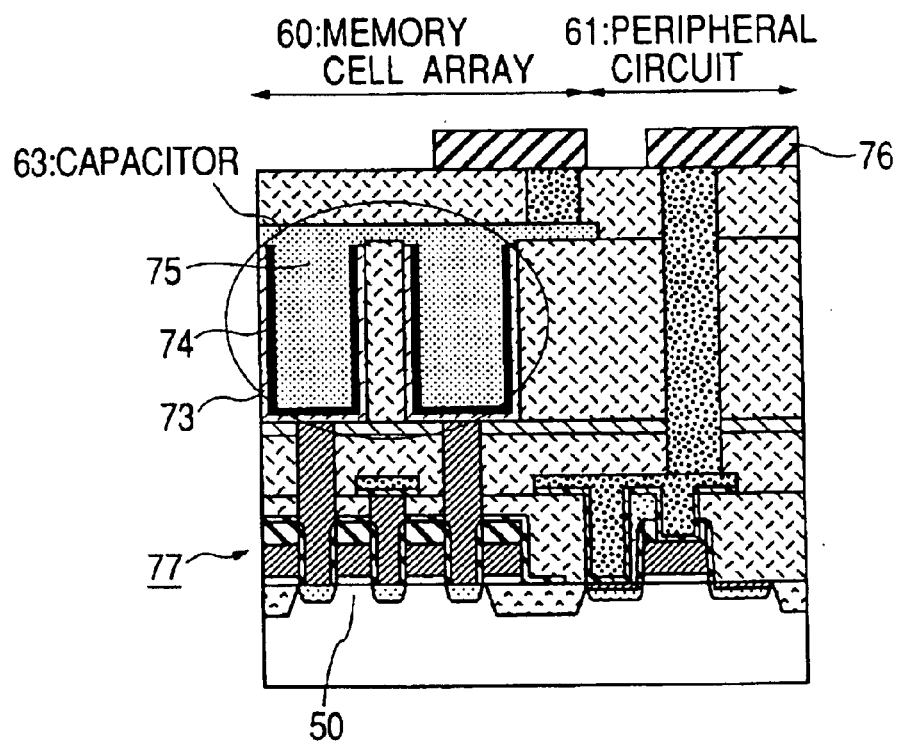
FIG. 2 is a cross sectional view of an existent semiconductor memory device.
Figure 3:
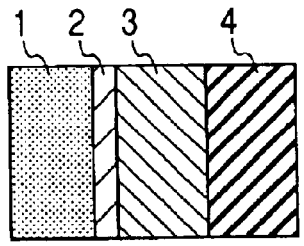
FIG. 3 is a cross sectional view showing the stacking of a memory cell according to the invention of the present application and a band structural view in various states.
Figure 3:
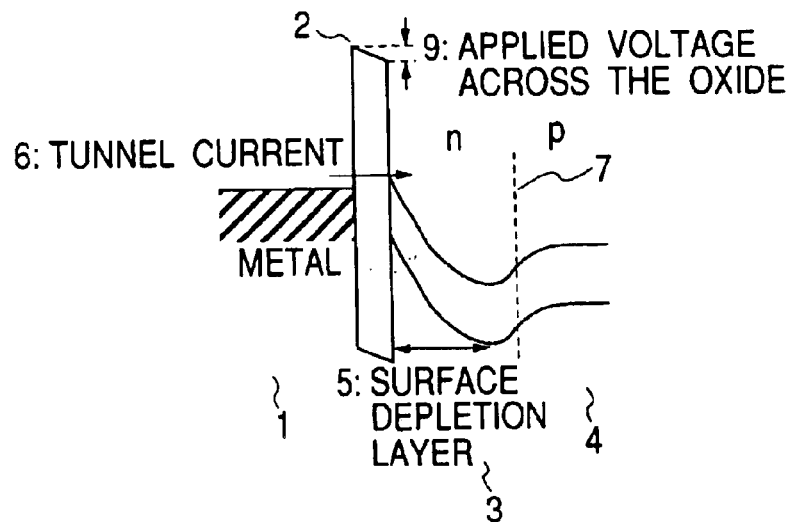
Figure 3:
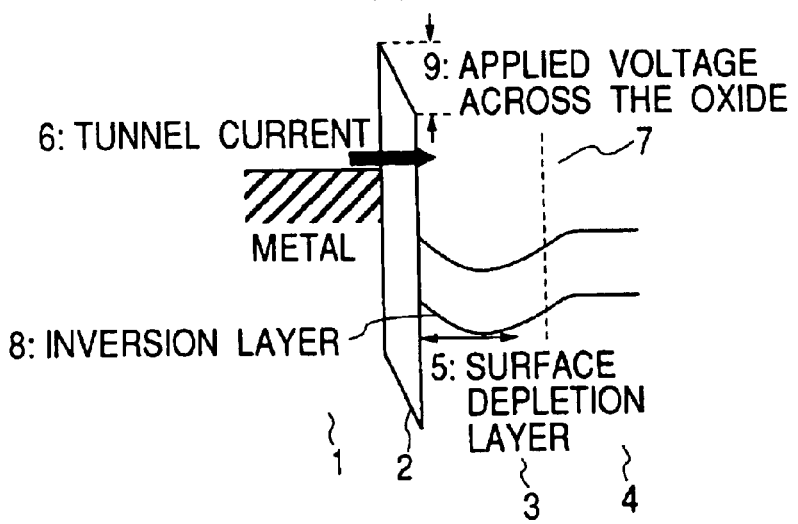
Figure 4:
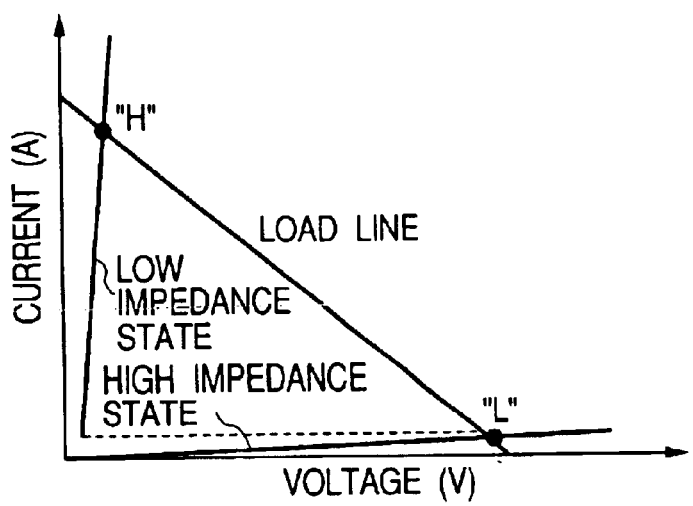
FIG. 4 is a graph showing a memory operation characteristic of a memory cell used in the invention of the present application.
Figure 5:
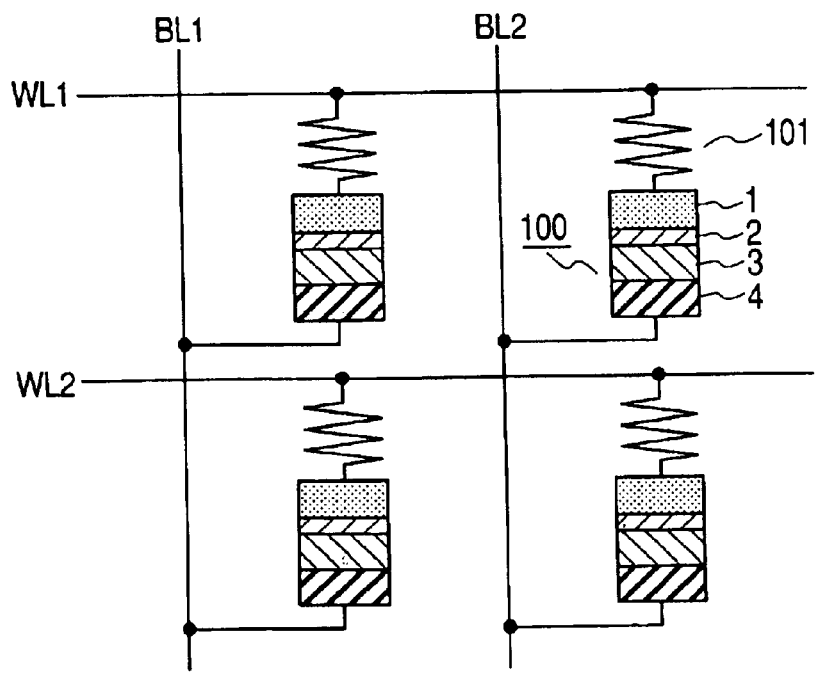
FIG. 5 is a view showing an arrangement of a memory array of a semiconductor memory device.
Figure 6:
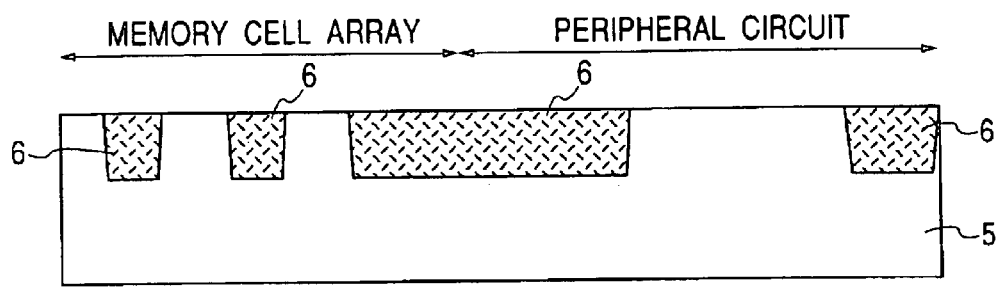
FIG. 6 is a cross sectional view in the direction perpendicular to a bit line and an upper plan view in one manufacturing step for a semiconductor memory device according to the invention of the present application.
Figure 6:
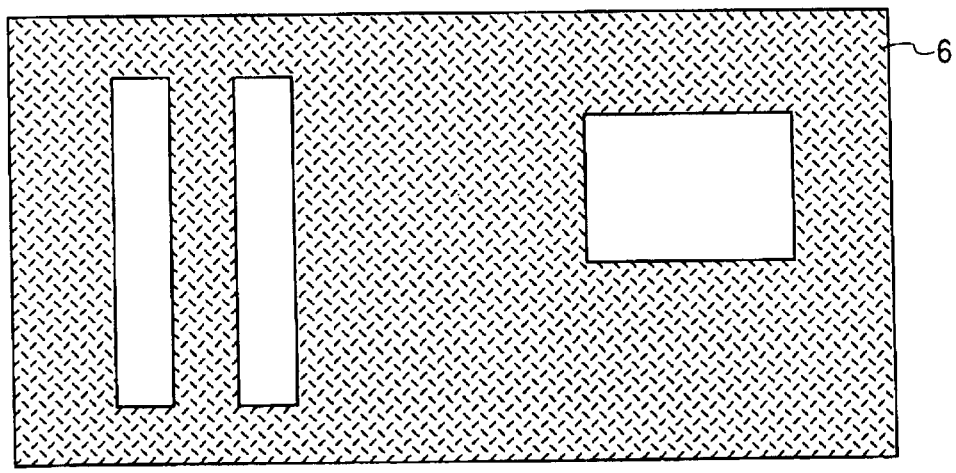

At first, P-type semiconductor substrate (5) is provided to which an isolation oxide (6) is formed by using a well-known selective oxidation method or a shallow trench isolation method. In this embodiment, the shallow trench isolation method capable of planarizing the surface was used. FIG. 6 is referred to. FIG. 6($a$) is a cross sectional view and FIG. 6($b$) is a plan view. In FIG. 6, a portion of a memory array and a peripheral circuit is shown. At first, a separation trench of about 0.3 $\mu$m depth is formed to the substrate 5 by a dry etching method. After removing damages caused by dry etching on the trench side wall or the bottom, a silicon oxide was deposited at a film thickness of about 0.7 $\mu$m by using a well-known CVD (Chemical Vapor Deposition) method. Then, the oxide at a portion other than the trench is selectively polished by a well-known CMP (Chemical Mechanical Polishing) method to leave only the oxide 6 buried in the trench. FIG. 6($a$) shows this state. FIG. 6($b$) shows an upper plan view after forming the device isolation region. FIG. 6($a$) corresponds to a cross sectional view taken along A—A in FIG. 6($b$).

The structure of the semiconductor memory device has a feature in that the device forming region in the memory cell array constitutes a simple line and space. This structure is suitable to the application of lithography of resolution enhancement technology such as phase shifting method.

Figure 7:
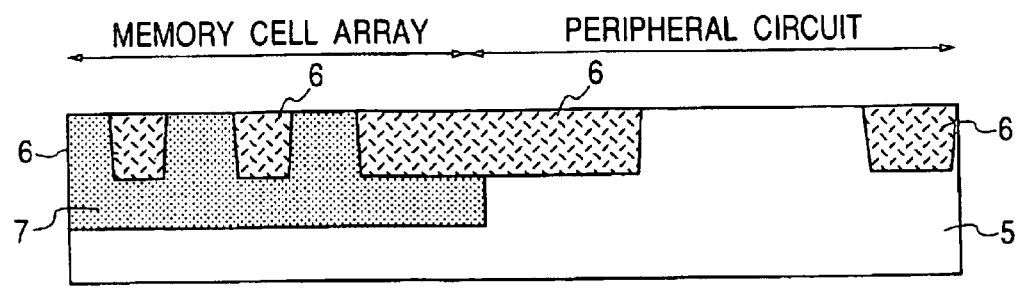
FIG. 7 is a cross sectional view in the direction perpendicular to a bit line in one manufacturing step for a semiconductor memory device according to the invention of the present application.

Then, two types of wells of different conduction types were formed by implantation of impurities at high energy. An N-type well 7 is formed in the memory cell array region in this embodiment. FIG. 7 shows this state.

Figure 8:
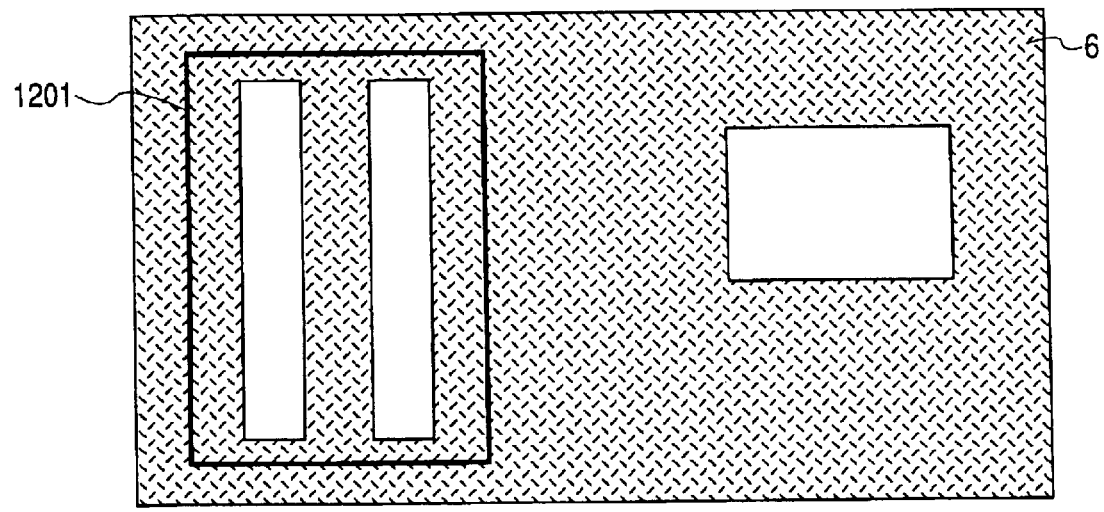
FIG. 8 is an upper plan view in one manufacturing step for a semiconductor memory device according to the invention of the present application.
Figure 9:
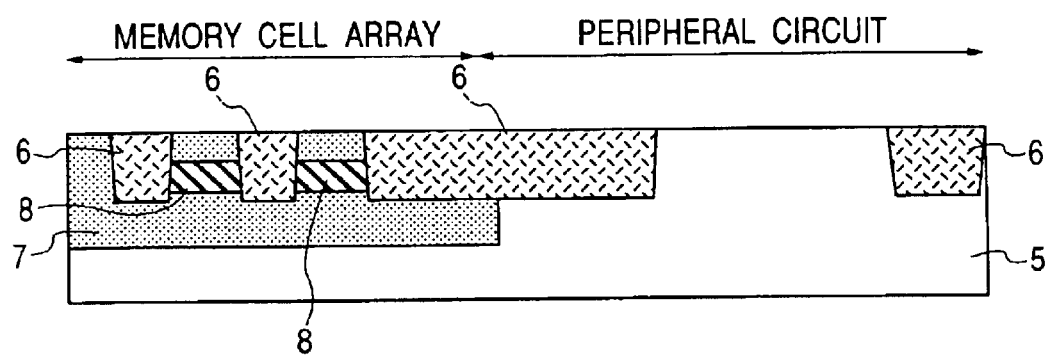
FIG. 9 is a cross sectional view in the direction perpendicular to the bit line in one manufacturing step for a semiconductor memory device according to the invention of the present application.

Successively, as shown in FIG. 8, boron is implanted into a memory cell array region under an acceleration energy of 50 KeV at a dose of $5 \times 10^{14}$ cm$^{-2}$ using a resist film (1201) opened only for the portion of the memory cell array as a mask. Then, boron ions are activated by an annealing step at 900° C. for 10 sec. FIG. 9 shows this state.

The thus formed P-type diffusion layer (8) constitutes bit lines in the memory array. What is important in this case is that the P-type diffusion layer (8) is electrically isolated by device isolation oxide (6) in a self-alignment manner by making the depth of the P-type diffusion layer (8) shallower than the thickness of the isolation oxide (6). This is because the width of the P-type diffusion layer (8) in parallel with the surface of the substrate is defined by an isolation oxide (6) which is an insulative material and formed previously, when the depth of the P-type diffusion layer (8) is shallower than the thickness of the isolation oxide (6).

Figure 10:
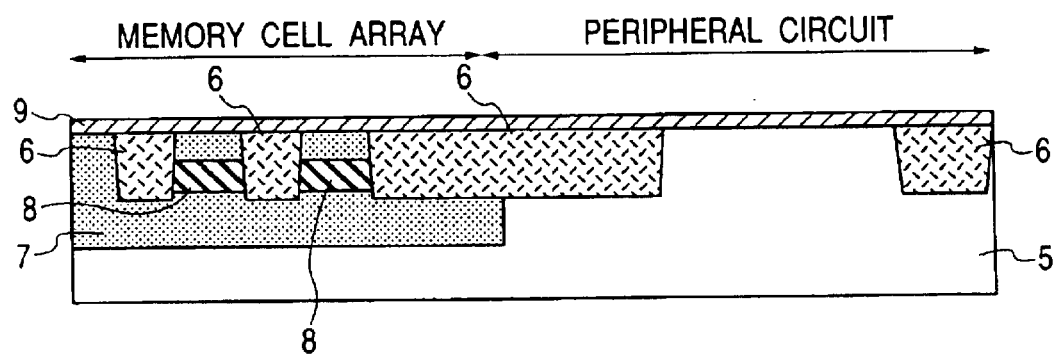
FIG. 10 is a cross sectional view in the direction perpendicular to the bit line in one manufacturing step for a semiconductor memory device according to the invention of the present application.

Then, after cleaning the surface of the thus prepared semiconductor substrate, an oxide (9) was grown by a well-known thermal oxidation method as shown in FIG. 10. In this step, the oxidation temperature is at 800° C. and the film thickness of the oxide was 3 nm. The oxide (9) forms a gate oxide for the MISFET in the region of the peripheral circuit and forms a tunnel layer in the region of the memory array.

Figure 11:
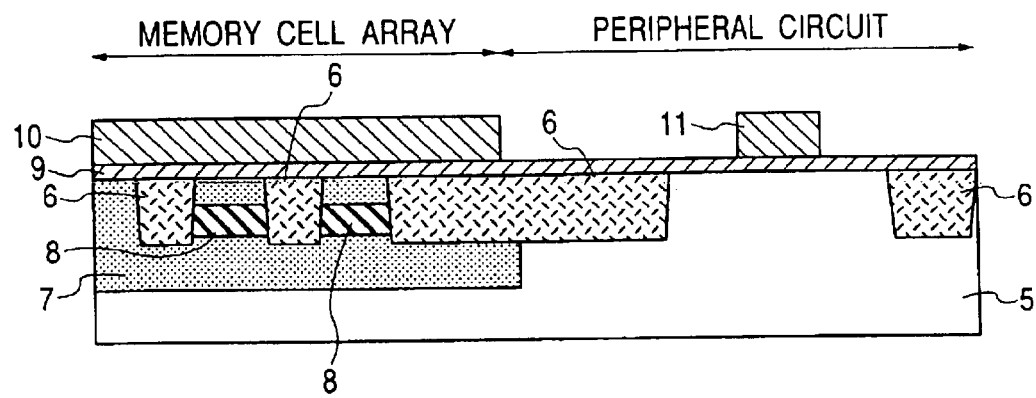
FIG. 11 is a cross sectional view in the direction perpendicular to the bit line in one manufacturing step for a semiconductor memory device according to the invention of the present application.

Further, as shown in FIG. 11, polycrystal silicon containing phosphorus at high concentration was deposited to a thickness of 100 nm as a word line (10) and a gate electrode (11) to the surface of the oxide. Polycrystal silicon containing, for example, boron at high concentration may also be used instead of phosphorus.

In this embodiment, while polycrystal silicon was used as the electrode material, it is of course possible to use a multi-layer of metal and polycrystal silicon in which a barrier metal for suppressing reaction between them in order to decrease the gate resistance. As the metal, a silicide layer not reacting with polycrystal silicon may also be used.

The bistable diode as a basic constitution of the invention of the present application is preferably constituted as described below. The basic structure has a multi-layer structure comprising the conductive layer 1, the insulating layer 2, the n-type silicon layer (3) and the p-type silicon layer (4) as described above.

There can be used, for example, N-type/P-type polycrystal silicon, tungsten, aluminum or copper for the conductive layer 1, silicon oxide layer, silicon nitride and silicon oxinitride layer for the insulating layer (2). Further, usual material can be used for the n-type silicon layer (3) and the P-silicon layer (4). The impurity concentration used is generally within a range from $10^{16}$ cm$^{-3}$ to $10^{19}$ cm$^{-3}$. The thickness for each of the layers used generally ranges from 50 nm to 300 nm for the conductive layer (1) and from 1 nm to 3 nm for the insulating layer (2). The structure in which the ordering of the layer is replaced between the n-type silicon (3) and the p-type silicon (4), the invention can be practiced substantially under the same conditions. Another embodiment to be described later is also basically based on the conditions for each of the layers described above.

Figure 12:
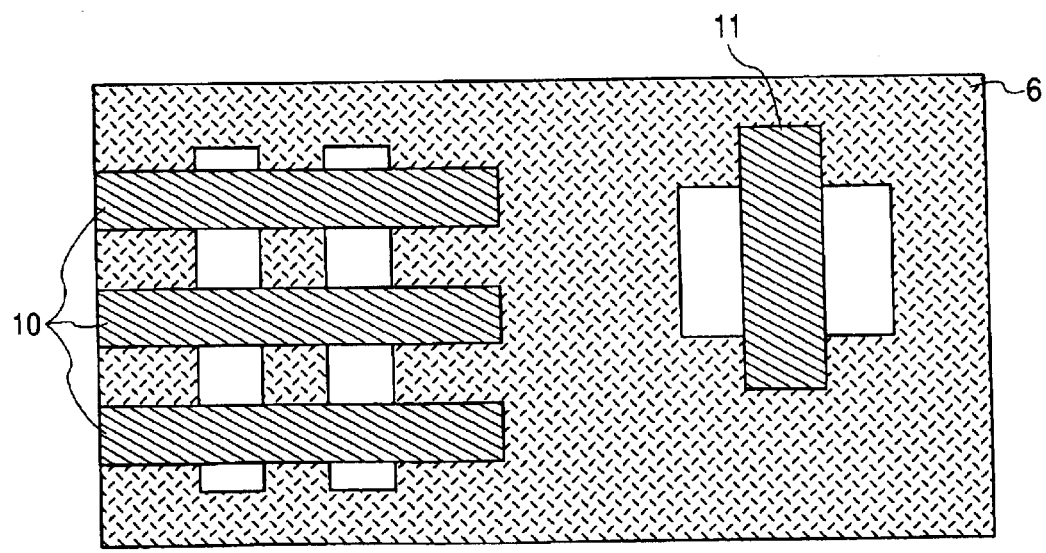
FIG. 12 is an upper plan view in one manufacturing step for a semiconductor memory device according to the invention of the present application.

Then, it was fabricated into the shape of a gate electrode (11) in the region for the peripheral circuit and the shape of a word line (10) in the memory array by using a well-known dry etching method as shown in FIG. 12. FIG. 12 is an upper plan view of the semiconductor substrate prepared in this state.

Further, for forming a diffusion layer 13 in the region for the peripheral circuit, impurity ions are implanted using the region for the gate electrode and the resist as a mask region. Arsenic was implanted in an amount about at $5\times10^{14}$ cm$^{-2}$ to the n-type MOSFET, while boron was ion implanted by the identical amount to the p-type MOSFET. Then, the implanted impurities were activated by a heat treatment, specifically, by heating the substrate under the conditions at 950° C. for 10 sec, to form a diffusion layer 13 for the region of the peripheral circuit. The diffusion layer itself may be formed basically by usual structure and method.

Figure 13:
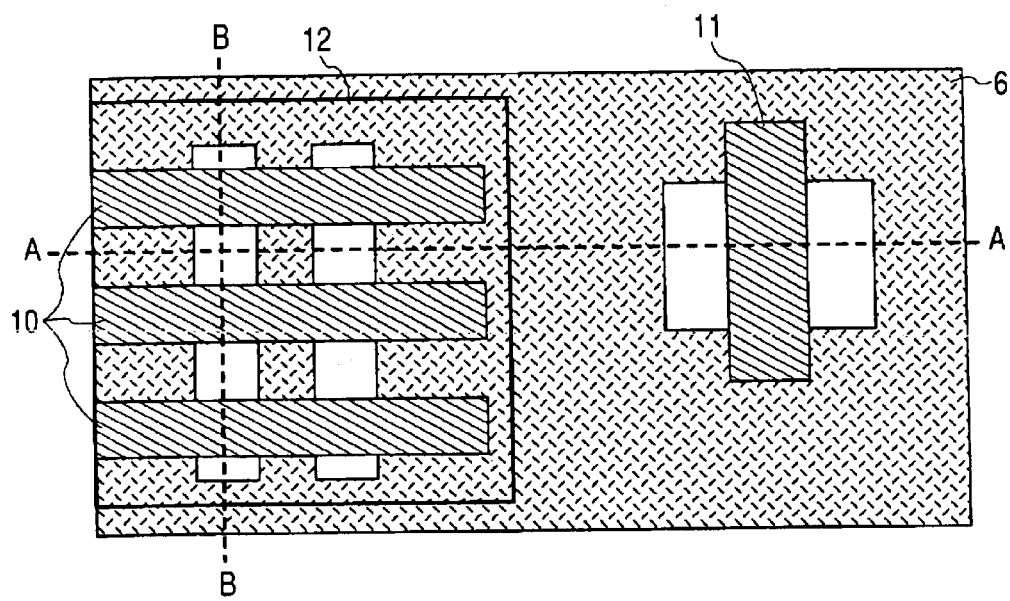
FIG. 13 is an upper plan view in one manufacturing step for a semiconductor memory device according to the invention of the present application.

Then, a memory array is formed. Since the memory cell is continuous in the direction of the bit lines in this stage, it has to be isolated for every cell. For this purpose, as shown in FIG. 13, the substrate is etched using a resist mask (12) in which only the memory array region is opened and using the word line electrode as a mask. It is conducted specifically as described below.

Figure 14:
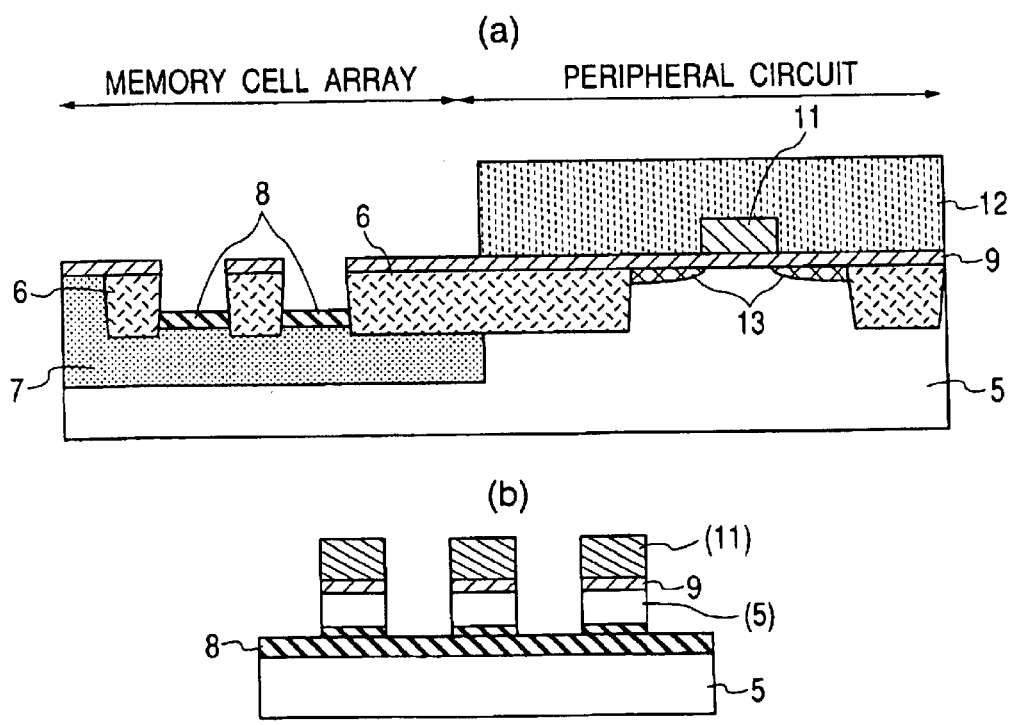
FIG. 14 is a cross sectional view in the desired direction in the view shown in FIG. 13.

At first, a 3 nm tunnel oxide layer is etched. Successively, as shown in FIG. 14(*a*), silicon substrate is etched by 200 nm to expose the P-type diffusion layer (8) as the bit line. FIG. 14(*a*) is a cross sectional view in the direction A—A in FIG. 13. The peripheral circuit is covered with the resist 12. As a result, the cross sectional view in the direction perpendicular to the word line is as shown in FIG. 14(*b*) in which the memory array is isolated in a self-aligned manner for every cell. As apparent from the foregoings, since the memory cell is formed in the self-aligned manner relative to the bit line and the word line in this embodiment, there is no problem with the misalignment and there is no scattering of the contact area, so that it has a feature that the cell characteristic less varies.

Figure 15:
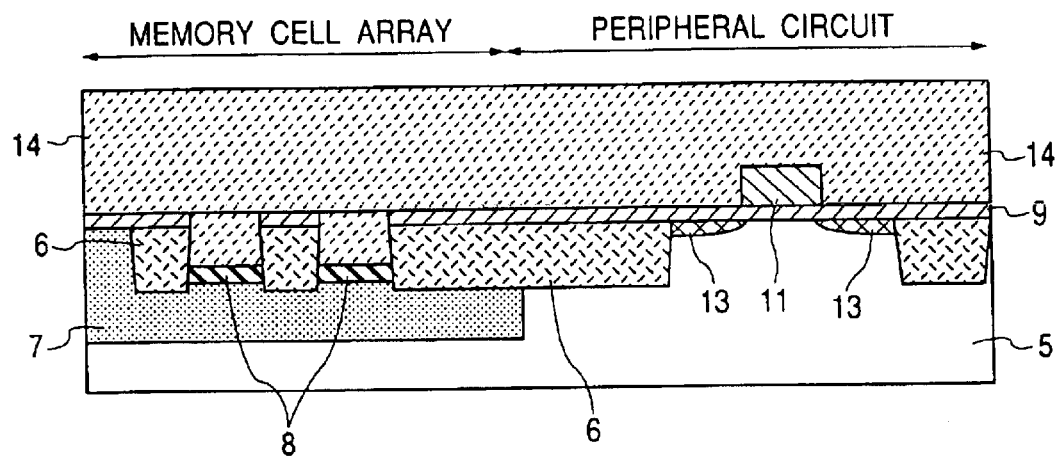
FIG. 15 is a cross sectional view in the direction perpendicular to the bit line in one manufacturing step for a semiconductor memory device according to the invention of the present application.
Figure 16:
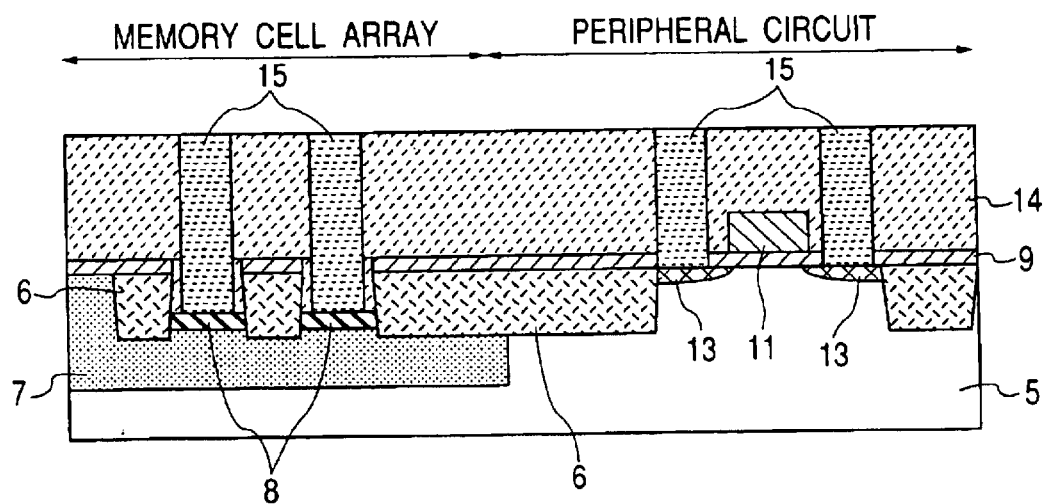
FIG. 16 is a cross sectional view in the direction perpendicular to the bit line in one manufacturing step for a semiconductor memory device according to the invention of the present application.

Then, the resist (12) is removed, an oxide layer (14) of about 0.7 μm is deposited by a well-known CVD method and planarized by a well-known CMP method. FIG. 15 is a cross sectional view showing the state. Successively, contacts are apertured to the diffusion layer (8) to form the bit line in the memory cell array region and to the diffusion layer 13 and the gate electrode (11) of the MOSFET in the peripheral circuit. A Ti/TiN/W multi-layer is formed by a well-known CVD method to the aperture to form a W plug (15). The plugs are fabricated by a well-known CMP method. FIG. 16 is a cross sectional view showing the state.

Figure 17:
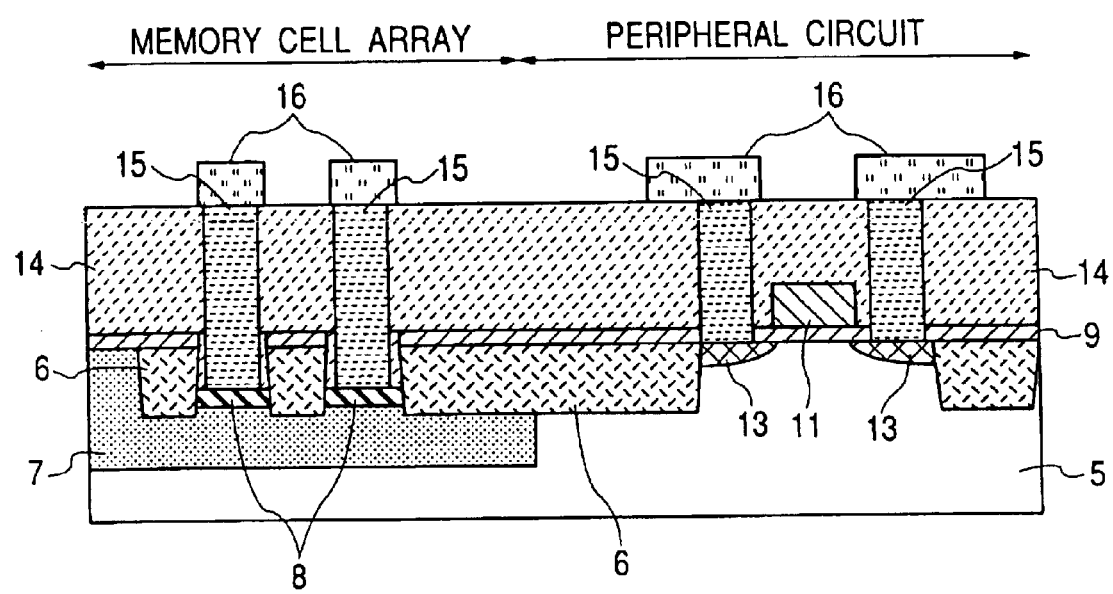
FIG. 17 is a cross sectional view in the direction perpendicular to the bit line in one manufacturing step for a semiconductor memory device according to the invention of the present application.
Figure 18:
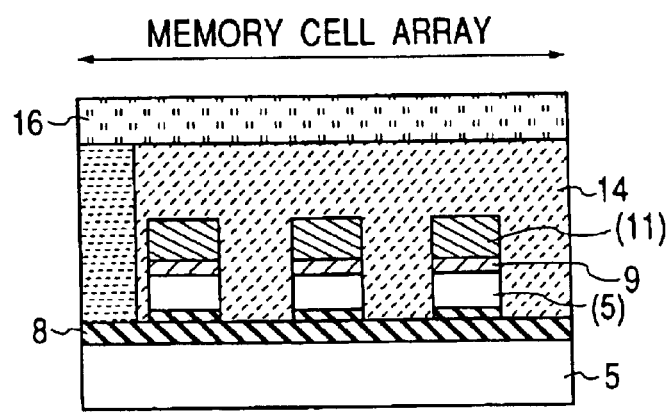
FIG. 18 is a cross sectional view in the direction perpendicular to the word line in one manufacturing step for a semiconductor memory device according to the invention of the present application.

The advantage of this structure is reduction in the bit line resistance. That is, as shown in FIG. 17, metal interconnect layer (16) is formed. FIG. 18 shows a cross sectional view in the section perpendicular to the word line in the memory cell array. Since the bit line (8) of high resistance comprising the diffusion layer is shunted with the interconnect layer 16 of low resistance, the apparent resistance of the bit lines can be reduced.

Figure 19:
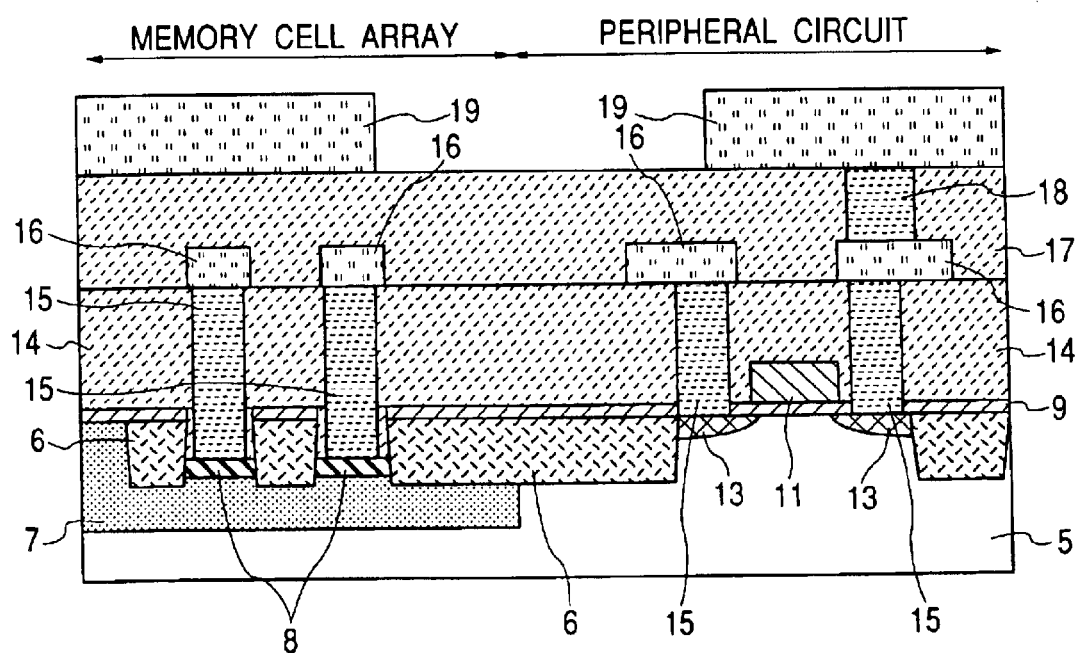
FIG. 19 is a cross sectional view in the direction perpendicular to the bit line in one manufacturing step for a semiconductor memory device according to the invention of the present application.

Further, an interlayer insulation layer (17) is deposited, a plug (18) is formed after aperturing a contact, and interconnect layer (19) is formed to obtain a desired semiconductor memory device. FIG. 19 is a cross sectional view showing this state.

Finally, the advantageous features of this invention are summarized as below.

At first, since a capacitor is not required, height difference between the memory cell array and the peripheral circuit is small. Further, since no thermal step accompanying the capacitor step is required, the performance of the peripheral circuit MISFET is excellent. Further, compared with DRAM having existent 1 transistor memory, since the memory cell area is about one-half and the process is much more simplified, high yield and low cost can surely be expected.

<Embodiment 2>

Embodiment 2 concerns a method of attaining particularly high speed memory operation.

One of important factors for determining the operation speed of the semiconductor memory device according to the invention of the present application is a tunnel current at a low impedance state that flows to the memory cell upon data reading. A most effective method for increasing the tunnel current is thinning of a tunnel oxide. By the way, thinning for the gate oxide in the region of the peripheral circuit has a conflicting characteristic of increasing the consumption power during stand-by state. Usually, in the structure as in the Embodiment 1 described above, the material and the dimension such as width, length and thickness of various materials constituting the semiconductor device are designed while taking both of such characteristics into a consideration.

Under the background described above, this example shows a structure further improved in this regard. Accordingly, this example can reduce the consumption power in the region of the peripheral circuit while maintaining high operation speed of the semiconductor memory device. Further, this can facilitate the design for each of portions in the semiconductor device.

In this embodiment, film thickness of the oxide is made different between the memory array and the peripheral circuit. That is, the film thickness of the oxide in the memory cell is thinned so as to ensure a sufficient tunnel current, while the oxide in the peripheral circuit is set to a film thickness not increasing the consumption power during the stand-by state. Only the main portion is to be explained below. Other matters are basically identical with those described above.

Figure 20:
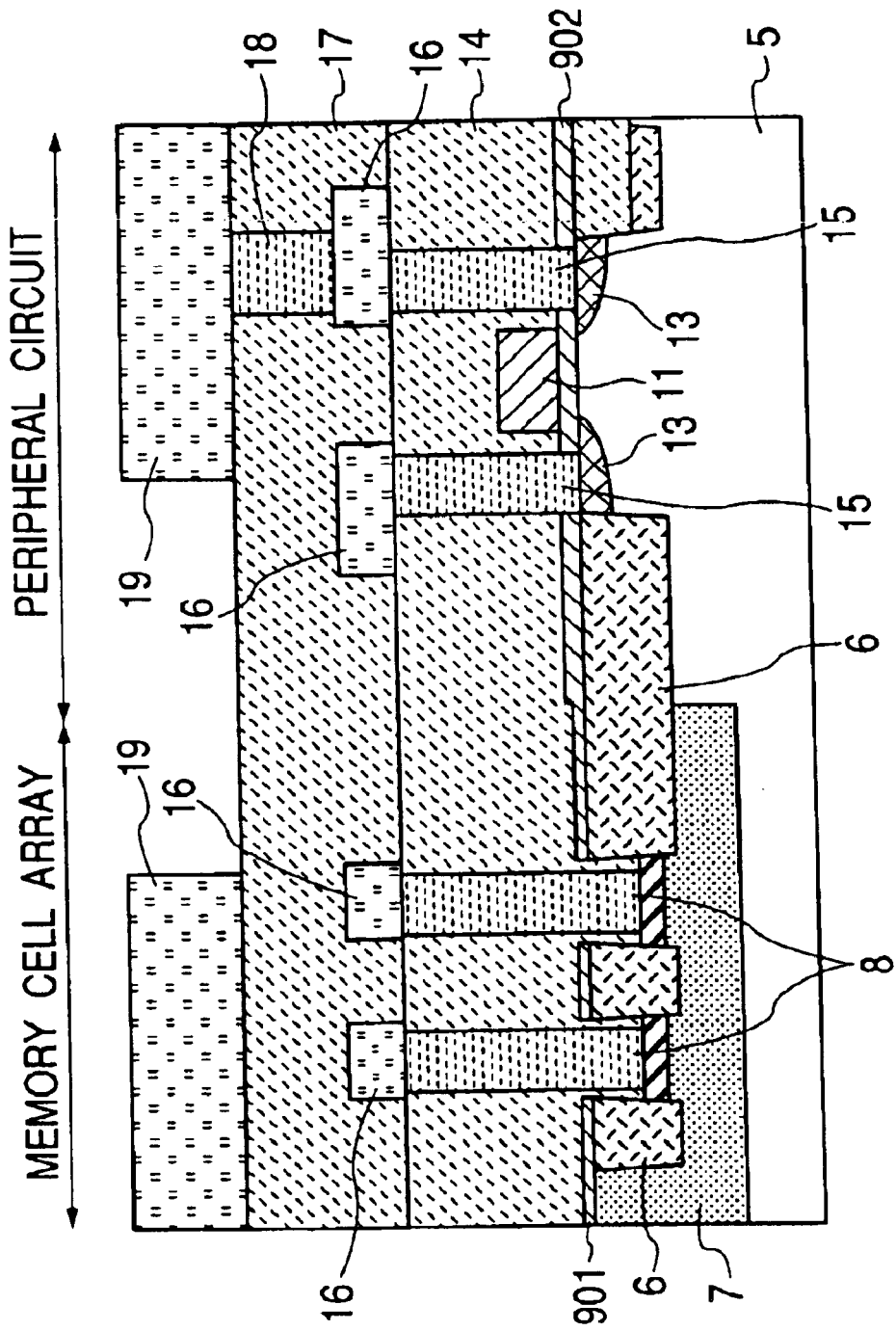
FIG. 20 is a cross sectional view in the direction perpendicular to the bit line in one manufacturing step for a semiconductor memory device according to the invention of the present application.

FIG. 20 shows a cross sectional view of this example. Reference numerals for respective portions except for insulating layers 901 and 902 described below are identical with those explained above. In this example, the tunnel oxide (901) in the memory array region is 1.5 nm and the gate oxide 902 in the region of the peripheral circuit is 3 nm.

Manufacturing steps other than the formation of the oxide are identical with those in Embodiment 1. The tunnel/gate oxides of the two type of film thickness are formed as described below. At first, an oxide of 1.5 nm was formed over the entire surface of a substrate. Then, only the memory cell array region is opened and the oxide film of the memory array is removed by wet etching using a resist mask covering the peripheral circuit region. Then, the entire surface of the substrate is oxidized to a thickness of 1.5 nm. In this way, the oxide could be formed to 1.5 nm in the memory cell array and 3 nm in the peripheral circuit. Higher speed for the memory operation could be attained in this example.

Since the portions other than those described in FIG. 20 are identical with those in FIG. 19, the detailed explanations are omitted.

<Embodiment 3>

Embodiment 3 concerns a method of particularly improving the characteristic of the tunnel oxide. Specifically, it proposes a method of increasing the current during data reading while suppressing the current during data holding. Only the principal portion is to be explained. Other matters are basically identical with those described previously.

Figure 21:
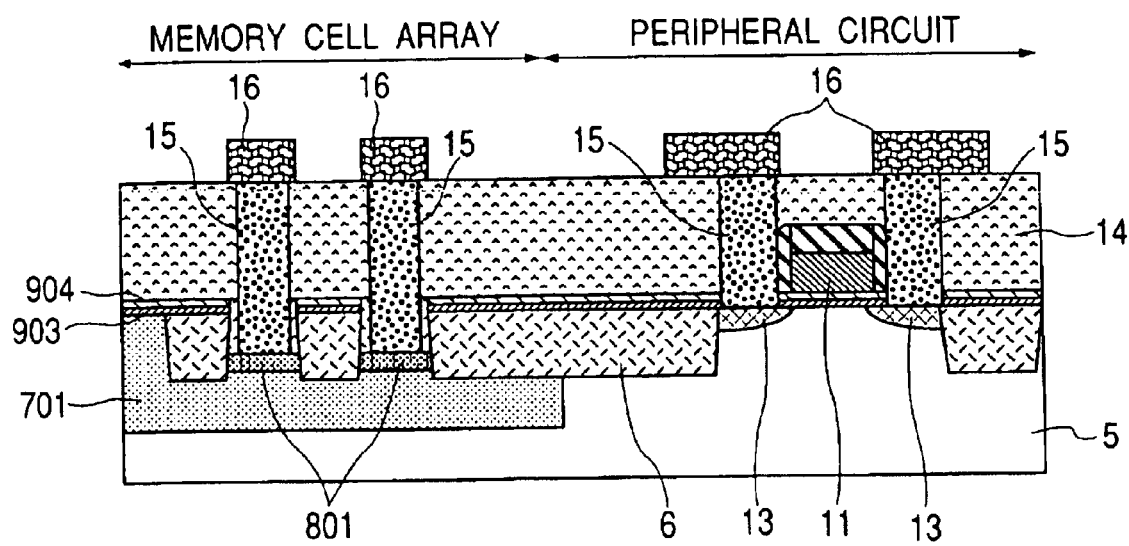
FIG. 21 is a cross sectional view in the direction perpendicular to the bit line in one manufacturing step for a semiconductor memory device according to the invention of the present application.
Figure 22:
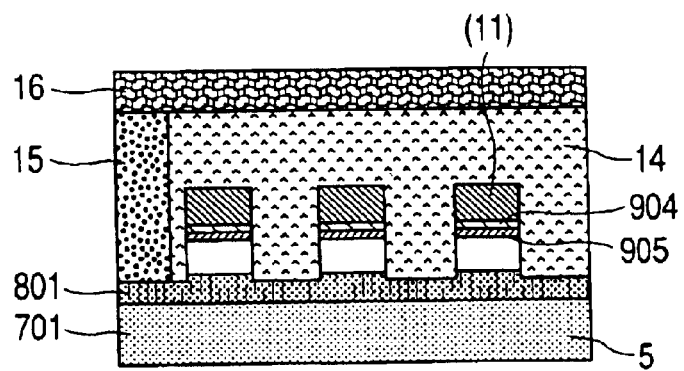
FIG. 22 is a cross sectional view in the direction perpendicular to the word line in one manufacturing step for a semiconductor memory device according to the invention of the present application.

For this purpose, a multi-layer of silicon oxide (903)/silicon nitride (904) was used as a tunnel/gate oxide. FIG. 21 shows a cross section in this state along the direction parallel with the word line. FIG. 22 shows a cross section in this state along the direction perpendicular to the word line in the memory cell array. In FIG. 21 and FIG. 22, the same reference numerals as those in the previous figures depict identical portions.

Figure 23:
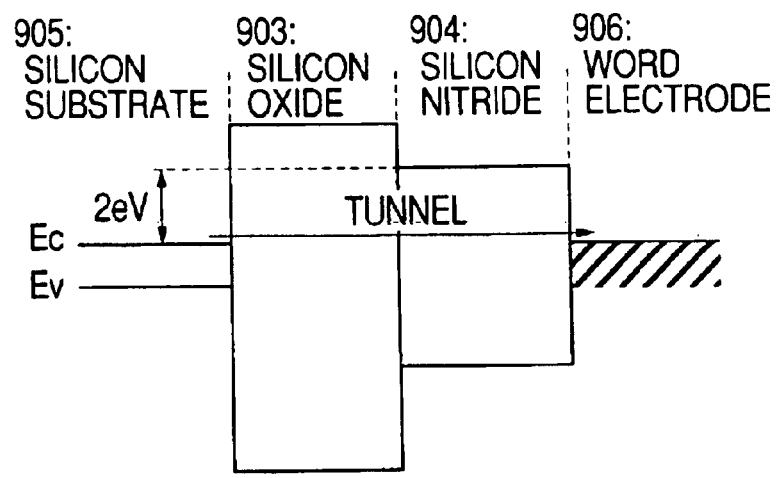
FIG. 23 is a band structural view of an insulating layer in a multi-layer.

Use of the multi-layer tunnel film provides the following effects. A schematic band structure during data holding is as shown in FIG. 23. In the figure, Ec shows the lower end of the conduction band and Ev shows the upper end of the valence electron band. The direction of the tunnel current is shown by an arrow.

Figure 24:
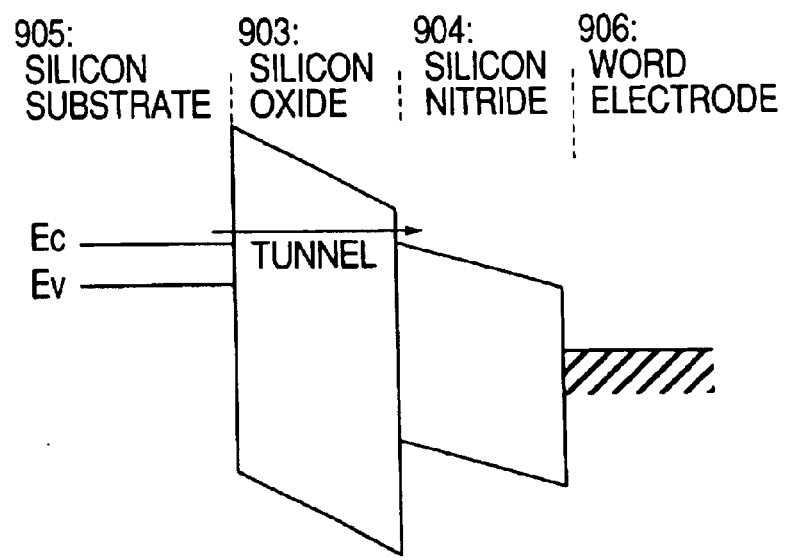
FIG. 24 is a band structural view of an insulating layer in a multi-layer.

Since both the silicon oxide 903 and the silicon nitride 904 function as a barrier for the tunnel in this case, the leak current is suppressed. On the other hand, a schematic band structure in a case of data reading, that is, where a bias higher than a predetermined level is applied to the word electrode as shown in FIG. 24. As apparent from the band diagram, only the silicon oxide 903 functions as the tunnel barrier for the electrons in this case, the effective thickness of the tunnel insulating layer is thinned compared with that during data holding. As a result, the tunnel current increases and high-speed data reading is enabled.

As apparent from the operation, the same effect can also be expected by the combination of insulating layers of different band gaps. It is a basic concept to use such a combination of insulating layers that an insulating layer having a larger forbidden band width functions as a barrier to the tunneling effect for the carriers during data reading. As the combination, silicon oxide/tantalum oxide, silicon nitride/tantalum oxide and the like may be used for instance, in addition to the examples described above. Actual design values are changed naturally depending on required characteristics, and the thickness for each of the insulating layers is selected within a range about from 5 Å to 30 Å. Further, in view of the design for the characteristics and the manufacture, combination of two layers is most practical but more than two layers of insulating layers may be constituted so as to agree with the basic concept of this invention described above.

Further, there exists a point to be noted in this embodiment. As apparent from the operation principle described above, a positive bias has to be applied to the word electrode. Accordingly, referring to the principle of the bistable diode, it is necessary that the bit line (801) is formed with an N-type diffusion layer while the well (701) covering the memory array is formed with P-type.

The manufacturing steps for this embodiment are substantially identical with those for Embodiment 1 except for the step for gate oxide. The step for manufacturing the gate oxide is as described below. At first, a silicon oxide of 2 nm film thickness is formed over the entire surface of the substrate. Successively, a silicon nitride of 1 nm film thickness is formed by surface nitridation to form a multi-layer of silicon oxide/silicon nitride.

As the material for the word electrode, N-type polycrystal silicon containing phosphorus at high concentration is used in this embodiment but polycrystal silicon containing boron at high concentration or metal such as tungsten may also be used. However, it is effective to use a material having a small work function as the word electrode in order to lower the application voltage during data reading with a view point of reducing the consumption power. In this meaning, N-type polycrystal silicon is optimum among them. The material for the word electrode can be considered in the same manner also in other examples than this embodiment.

<Embodiment 4>

Embodiment 4 concerns a manufacturing method and, among all, it relates to a manufacturing method particularly practically useful memory cell array. Only the principal portion is to be explained. Other matters are basically identical with those described previously.

Embodiment 1 includes a step of etching the silicon substrate using the word electrode (10) and the isolation oxide (6) as a mask upon isolation of the memory array for every cell as shown in FIG. 11 and FIG. 12. In this case, since the device isolation region (6) has a tapered shape, the device forming region has an inverted tapered shape. This results in the possibility of etch residue, more specifically, silicon remains after etching along the side wall when the silicon substrate is etched. This means that the memory array is not isolated for every cell. This embodiment concerns a manufacturing method for avoiding the occurrence of such failure.

Figure 25:
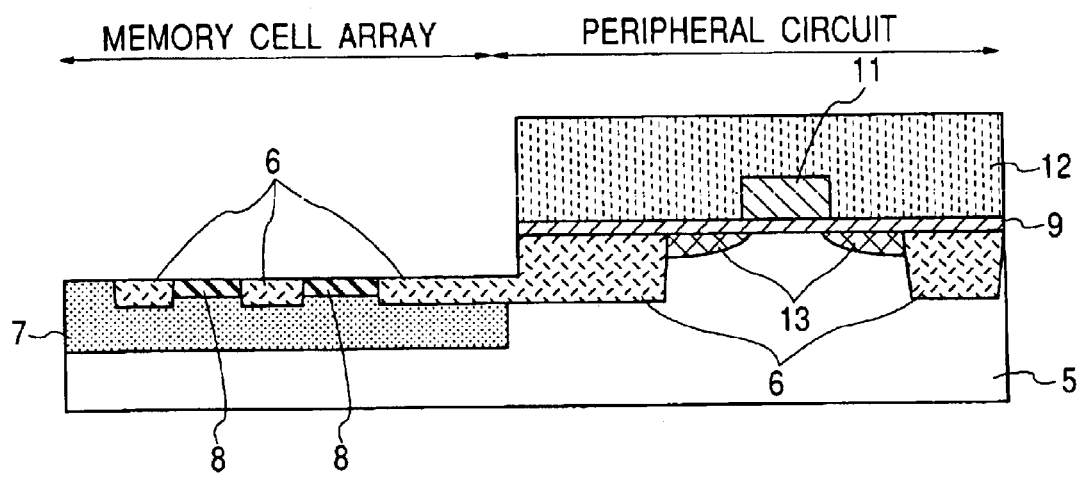
FIG. 25 is a cross sectional view in the direction perpendicular to the bit line in one manufacturing step for a semiconductor memory device according to the invention of the present application.
Figure 26:
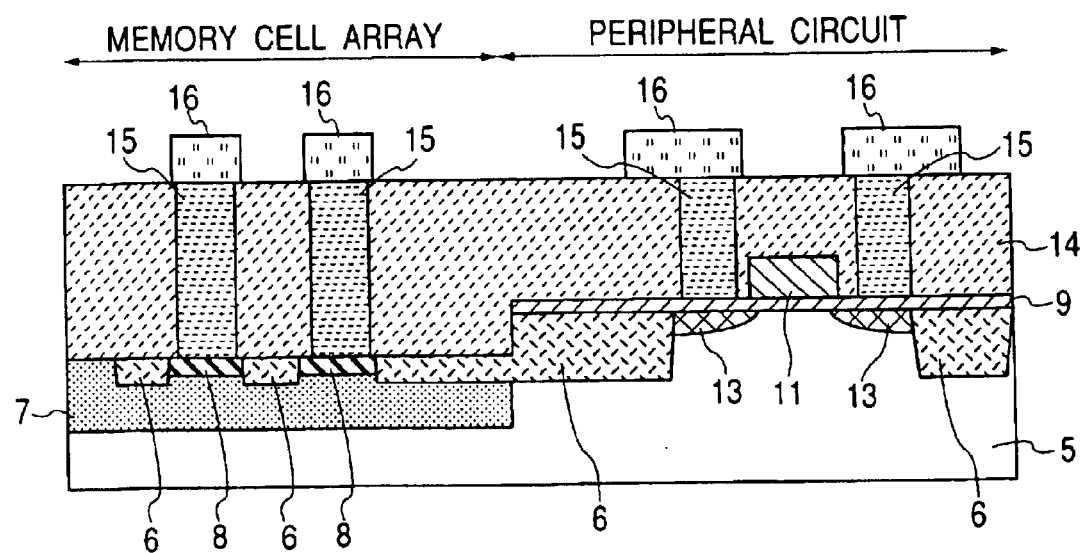
FIG. 26 is a cross sectional view in the direction perpendicular to the bit line in one manufacturing step for a semiconductor memory device according to the invention of the present application.

For this purpose, the silicon substrate is etched under the condition with no selectivity to the oxide film, that is, the isolation oxide (6) is etched simultaneously to obtain a state as shown in FIG. 25. That is, the device isolation insulating layer (6) and the diffusion layer (8) are basically in flush with each other. According to this example, protrusions such as etching residue pointed out before are not formed. As described above, according to this embodiment, the memory array can surely be isolated for every cell, in contrast to the case of Embodiment 1. Subsequently, an oxide interlayer (14) is deposited, plugs (18) and interconnect layer (19) are formed to obtain a desired semiconductor memory device. FIG. 26 is a cross sectional view showing this state. Since other portions than described above in this embodiment are identical with those in the previous embodiments, detailed explanations for them are omitted.

<Embodiment 5>

In Embodiment 5, a self-alignment process is applied upon opening of bit line contacts. As a result of applying this embodiment, since bit lines can be shunted at many locations without increasing the cell area, apparent bit line resistance can be greatly reduced. Only the principal portion is to be explained below. Other matters are basically identical with those described previously.

The steps up to the formation of the gate oxide are identical with those in Embodiment 1. It is of course possible to use plural, for example, two types of tunnel insulating layers in view of thickness or a multi-layer tunnel insulating layer can be used as described for Embodiment 2 or Embodiment 3 in combination with this embodiment.

Figure 27:
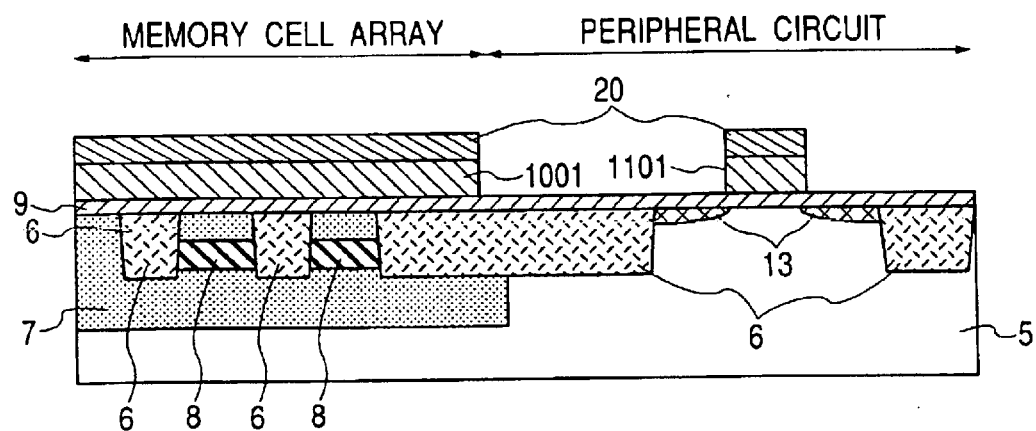
FIG. 27 is a cross sectional view in the direction perpendicular to the bit line in one manufacturing step for a semiconductor memory device according to the invention of the present application.
Figure 28:
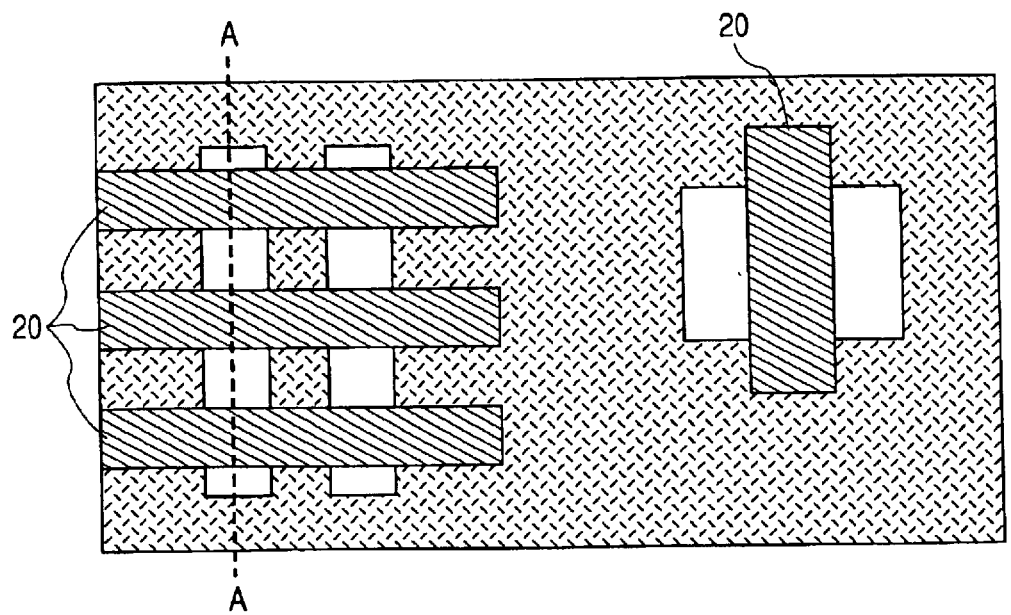
FIG. 28 is a upper plan view in one manufacturing step for a semiconductor memory device according to the invention of the present application.
Figure 29:
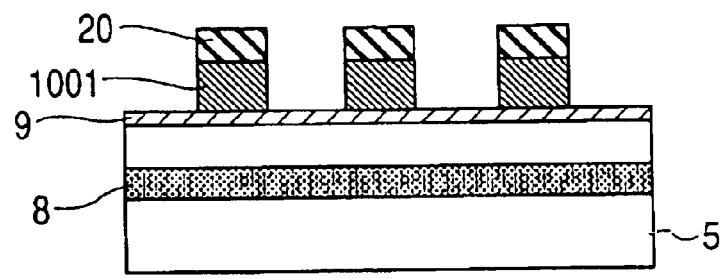
FIG. 29 is a cross sectional view in the direction perpendicular to the word line in one manufacturing step for a semiconductor memory device according to the invention of the present application.
Figure 30:
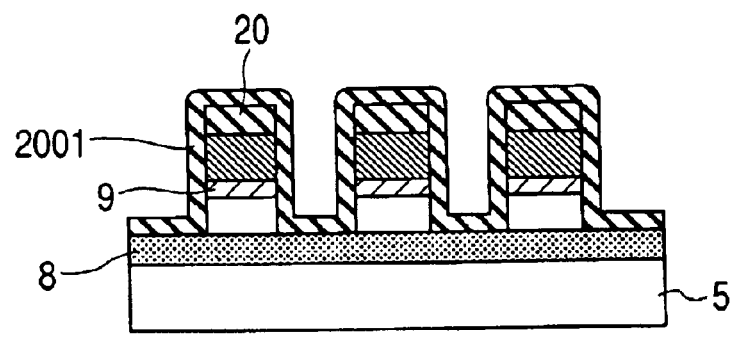
FIG. 30 is a cross sectional view in the direction perpendicular to the word line in one manufacturing step for a semiconductor memory device according to the invention of the present application.
Figure 31:
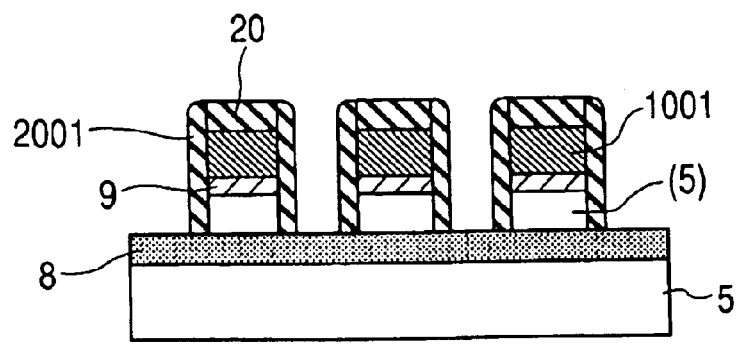
FIG. 31 is a cross sectional view in the direction perpendicular to the word line in one manufacturing step for a semiconductor memory device according to the invention of the present application.

Then, for the application of the self-alignment contact opening process, after depositing an electrode material that forms the word line (1001)/gate electrode (1101), silicon nitride (20) is deposited to 100 nm by a well-known CVD method and fabricated by well-known dry etching. FIG. 27 shows a cross sectional view in this state along the direction parallel with the word line. In FIG. 27, are shown a semiconductor substrate 5, an impurity diffusion region 8 and an insulating layer 9 as in the previous embodiments. an upper plan view in this case shown in FIG. 28. Further, FIG. 29 shows a cross sectional view along the direction vertical to the word line. Each of the cross sectional views for FIG. 29, FIG. 30 and FIG. 31 is a cross sectional view for each of the steps along the direction A—A in FIG. 28.

Further, the tunnel oxide and the silicon substrate are etched by 200 nm only in the memory array using the word electrode region as a mask. Successively, silicon nitride (2001) is deposited to 30 nm into a state as shown in FIG. 30. Then, silicon nitride is fabricated by anisotropic etching to 30 nm to form a side wall silicon nitride (2001) (FIG. 31).

Figure 32:
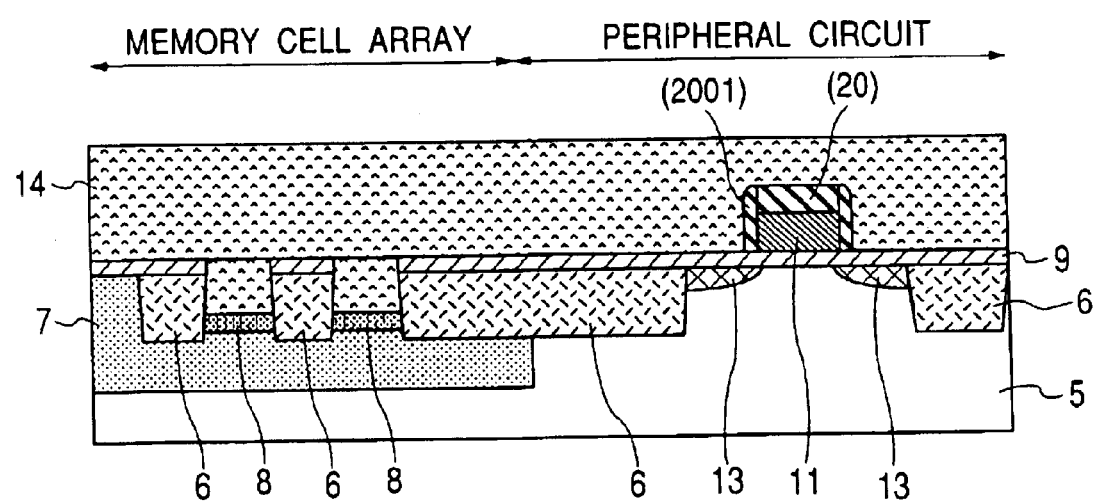
FIG. 32 is a cross sectional view in the direction perpendicular to the bit line in one manufacturing step for a semiconductor memory device according to the invention of the present application.

Then, after cleaning, a silicon oxide film (14) is deposited by 0.7 μm as an insulating interlayer and then flattened by a well-known CMP method (FIG. 32).

Figure 33:
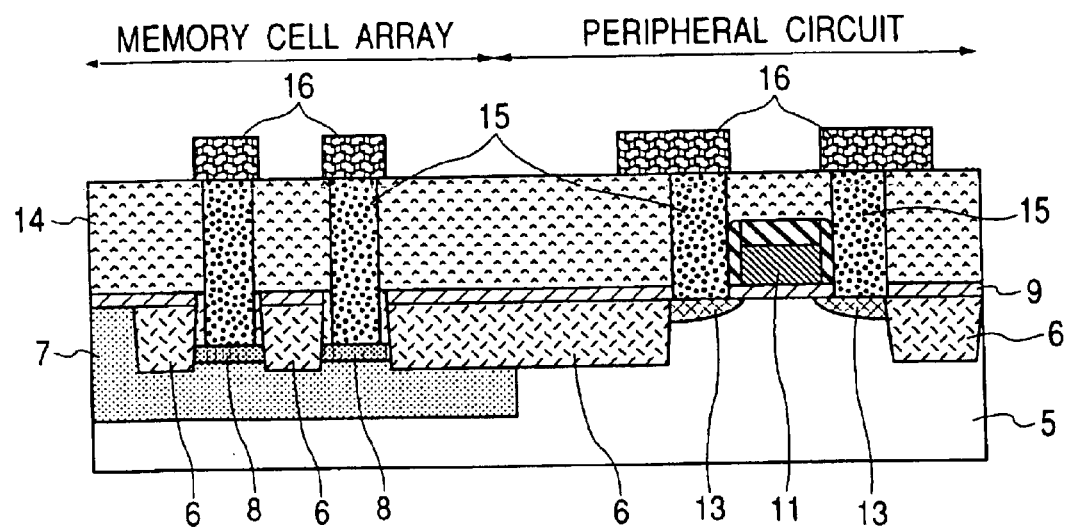
FIG. 33 is a cross sectional view in the direction perpendicular to the bit line in one manufacturing step for a semiconductor memory device according to the invention of the present application.
Figure 34:
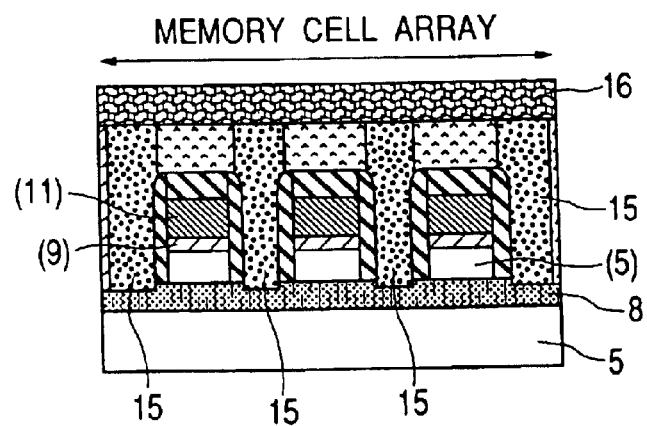
FIG. 34 is a cross sectional view in the direction perpendicular to the word line in one manufacturing step for a semiconductor memory device according to the invention of the present application.

Further, plugs (15) and interconnect layers (16) are formed in the same manner as in Embodiment 1 (FIG. 33). FIG. 32 and FIG. 33 are cross sectional views showing the memory array and the peripheral circuit. A cross sectional view in the direction vertical to the word line in the memory array is as shown in FIG. 34. As a result of the application of the self-aligned contact opening process using the insulative region 6, plural contacts can be opened in the bit line diffusion layer to greatly reduce the bit line resistance without increasing the area.

<Embodiment 6>

Embodiment 6 uses silicon on insulator (SoI: Silicon On Insulator) as a substrate. This embodiment has the following advantageous features. In Embodiments 1 to 5 described previously, the contact opening dry etching to the diffusion layer (8) in the memory cell array has to be conducted by controlling the time because of the absence of a layer as an etch stopper in the underlayer, for example, as shown in FIG. 14. However, by using the silicon on insulator substrate, etching can be stopped at the oxide layer (21) and the problems can be overcome.

Figure 35:
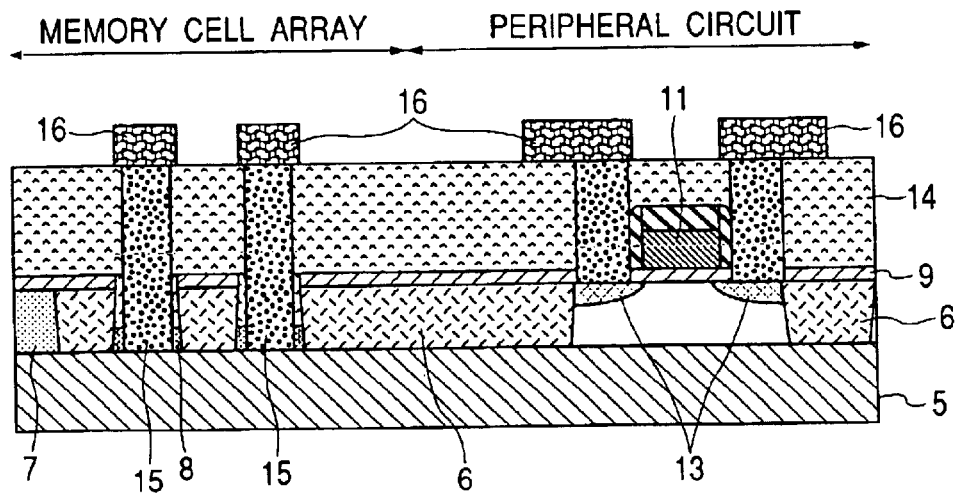
FIG. 35 is a cross sectional view in the direction perpendicular to the bit line in one manufacturing step for a semiconductor memory device according to the invention of the present application.

FIG. 35 shows a cross sectional view up to the formation of the first interconnect layer, and manufacturing steps in this embodiment are substantially identical with those in Embodiment 1.

Various modes from Embodiments 1 to 6 have been described above and it is apparent that the constitutions of various embodiments described above can be used in an appropriate combination to the memory device. Two or more of them can of course be combined and each of the advantageous feature can be utilized.

<Embodiment 7>

Figure 36:
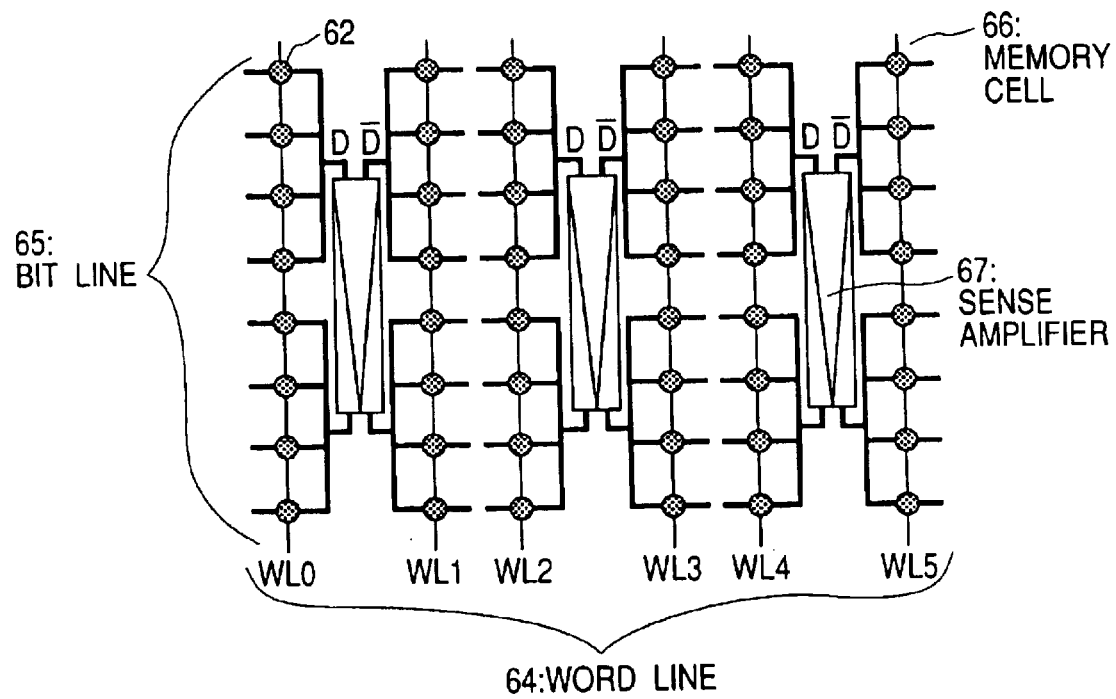
FIG. 36 is a view showing an example of a layout for sense amplifiers in a semiconductor memory device according to the invention of the present application.

Embodiment 7 relates to layout of a memory cell array according to the invention of the present application. FIG. 36 shows the layout of a memory cell array and sense amplifiers. In contrast to memories having a folded bit line structure, memory cells 66 are arranged to all intersections 62 between the word lines 64 and the bit lines 65. For the memory device, the constitution of various embodiments explained previously can be used. Combination of two or more of them is of course possible. The advantageous features of each of them can be utilized.

Since the memory according to the invention of the present application is adapted for non-destructive reading, one sense amplifier 67 is used in common with plural cells and the number of sense amplifiers can be decreased greatly compared with a semiconductor memory device having existent 1 transistor type memory cell. Then, as illustrated in FIG. 36, a system is adapted to bundle plural hit lines 65, which are selected by the switch and inputted into the sense amplifiers 67. As the effect obtained by reducing the number of the sense amplifiers 67, the number of division for the bit lines can be increased without increasing the chip area so much. As a result, the capacity for the bit line can be decreased to enable high speed operation of the memory.

<Embodiment 8>

Figure 37:
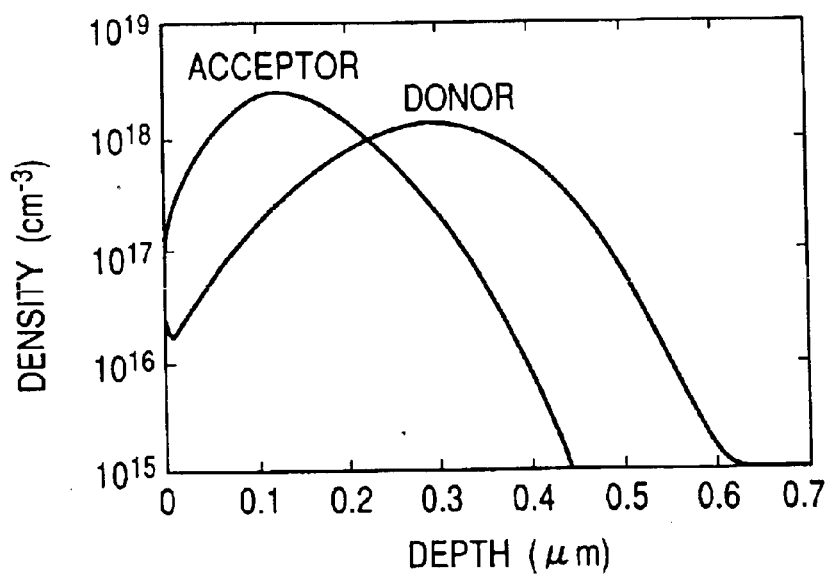
FIG. 37 is a graph showing one impurity profile of a memory cell in a semiconductor memory device according to the invention of the present application.

Embodiment 8 relates to a method of forming a memory cell for micro-miniaturizing the memory cell array according to the invention of the present application to a size of sub 0.1 μm level. As described already for Embodiment 1, bit lines can be formed in the self-aligned manner by making the PN junction that forms a memory cell shallower than the depth of the device isolation region. However, this involves a subject to be solved. That is, for attaining the memory operation, it is necessary to restrict the switching voltage in order to attain low voltage operation of the cell while suppressing punch-through in the depletion layer of the PN junction and the depletion layer of the MOS boundary simultaneously to attain the memory operation. For this purpose, a PN junction profile as shown in FIG. 37 is formed. In the graph, the abscissa expresses the depth from the surface of the semiconductor substrate and the ordinate expresses the impurity concentration. The graph shows each of profiles for the concentrations of the doner and the acceptor. The PN junction is formed around the intersection between both of the curves as the center.

Figure 38:
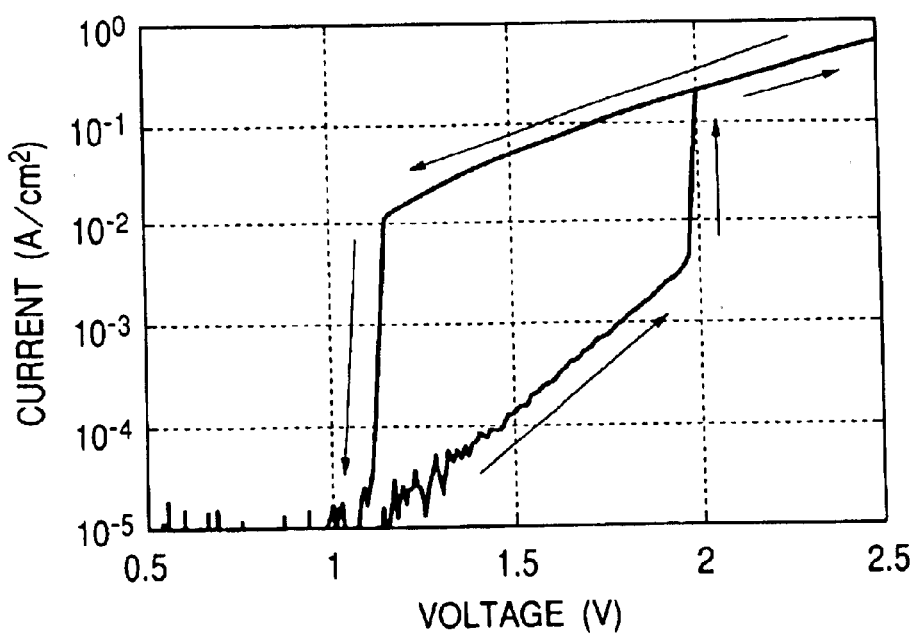
FIG. 38 is a graph showing current-voltage characteristic of a memory cell in a semiconductor memory device according to the invention of the present application.
Figure 39:
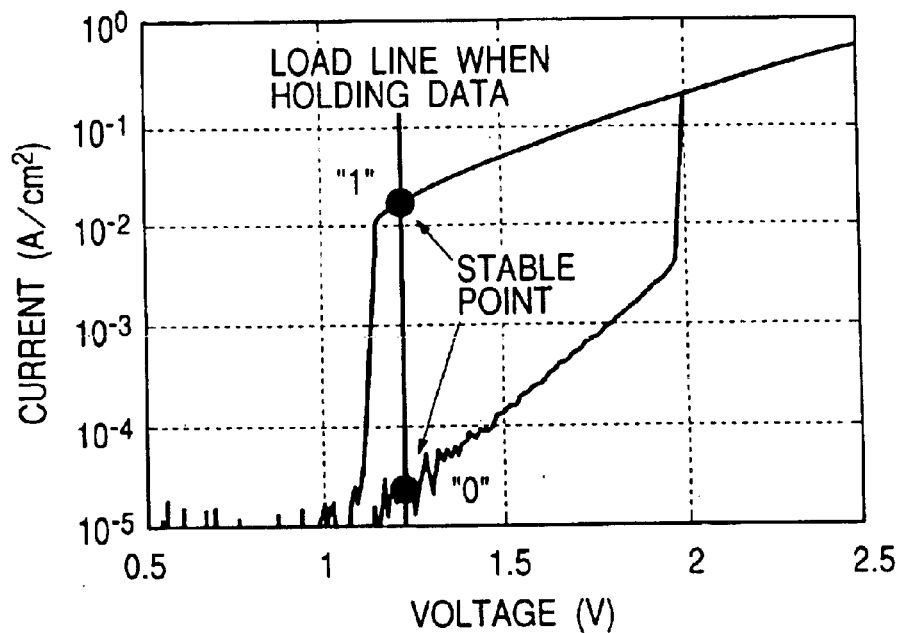
FIG. 39 is a graph showing the state during data holding of a memory cell in a semiconductor memory device according to the invention of the present application.
Figure 40:
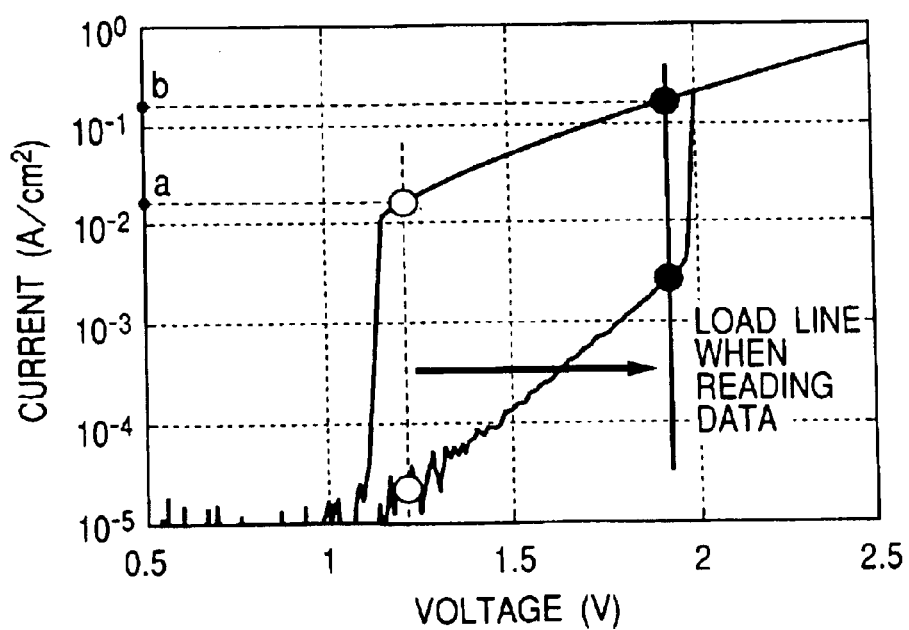
FIG. 40 is a graph showing the state during data reading of a memory cell in a semiconductor memory device according to the invention of the present application.

The advantageous feature is as described below. That is, a so-called retro-grade type profile is adopted in which the concentration is higher at the inside than on the surface of the substrate both for the P-layer and the N-layer. As a result, the concentration in the PN junction is increased and punch-through can be avoided. Simultaneously, since the impurity concentration at the MOS boundary is low, the switching voltage can also be set to 2 V or lower. In this embodiment, phosphorus was implanted under an acceleration voltage of 210 KeV, and at a dose of $3\times10^{13}$ cm$^{-2}$ and boron was implanted under an acceleration voltage of 30 KeV at a both of $3\times10^{13}$ cm$^{-2}$. The current/voltage characteristics of the thus obtained memory cell are as shown in FIG. 38, which exhibits a so-called hysteresis characteristic. In FIG. 38, FIG. 39 and FIG. 40 the abscissa represents the voltage and the ordinate represents the current.

Then, the operation of the memory cell is to be explained based on the characteristics. FIG. 39 shows a load line of a non-selected cell (stand-by state). With a view point of reducing the consumption power during stand-by state, an application voltage as low as possible providing that the data can be held (about 1.2 V in a case of the example of FIG. 39) is applied. On the other hand, the voltage applied to the word line and the bit line is changed during data reading into a load line state as shown in FIG. 40. Then, the data is sensed depending on the change of the flowing current. As can be seen from the operation, the current ratio of a to b in FIG. 40 is an aimed index for the performance of this memory. That is, increase of the reading current b during reading leads to high speed operation of the memory and, simultaneously, can increase the number of cells connected to one bit line, so that the chip area can be reduced.

It will be apparent that when the polarities of N and P conduction types of the semiconductor materials constituting the device of this embodiment are inverted, it can also operate in the same manner as the memory by inverting the polarity of the application voltage. It will be apparent that the method of forming this memory cell can be applied to the manufacturing methods as described in Embodiments 1 to 6.

<Embodiment 9>

Embodiment 9 relates to a method of controlling the switching voltage.

Figure 41:
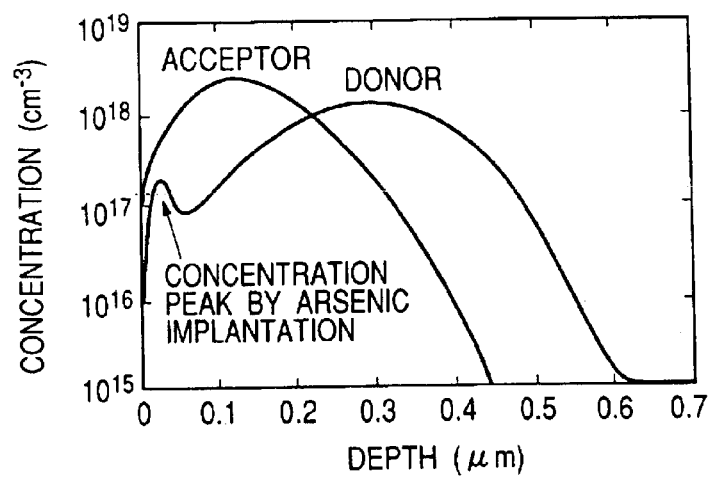
FIG. 41 is a graph showing one impurity profile of a memory cell in a semiconductor memory device according to the invention of the present application.

It is desirable that the switching voltage can be optionally set quite independently of suppression for punch-through. For this purpose, impurities are ion implanted to a shallow depth near the MOS boundary of the memory cell. In this embodiment, with an aim of lowering the switching voltage for low voltage operation, arsenic is ion implanted under an acceleration voltage of 80 KeV at a dose of $1 \times 10^{13}$ cm$^{-2}$ to a memory device having the impurity profile shown in FIG. 37. This results in a structure in which doner profile has a peak at the MOS boundary as shown in FIG. 41. This compensates the acceptor near the MOS boundary to lower the effective impurity concentration and the switching voltage can be lowered to 1.5 V. Phosphorus may also be used instead of arsenic. In this embodiment, arsenic is ion implanted in order to lower the switching voltage but boron may of course be implanted in order to increase the switching voltage. This method of forming the memory cell is applicable to the manufacturing methods described in Embodiments 1 to 6.

<Embodiment 10>

Figure 42:
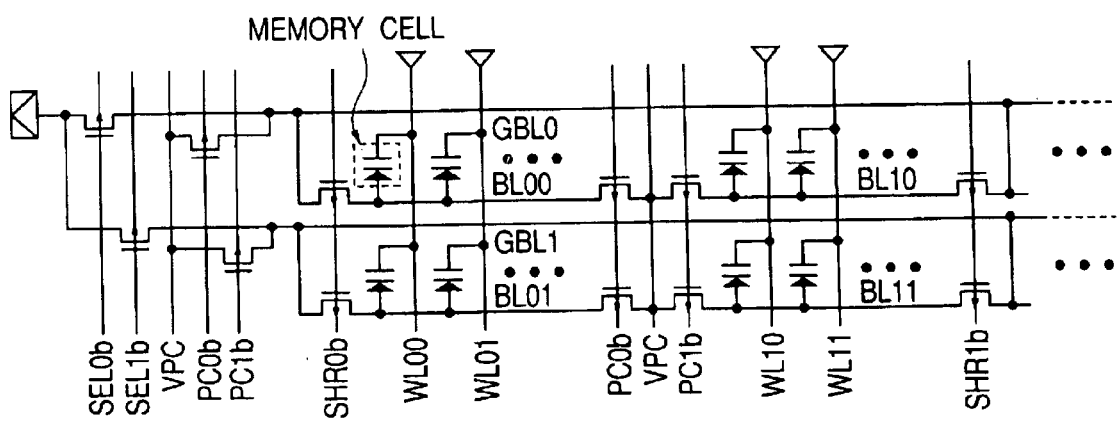
FIG. 42 is a circuit diagram showing an example of a memory cell array system in a semiconductor memory device according to the invention of the present application.

Embodiment 10 concerns a memory cell array. Since the memory cell according to the invention of the present application utilizes the tunnel phenomenon, ON current is basically small. Accordingly, in order to attain high speed operation of the memory, it is extremely important to reduce the bit line capacitance. For this purpose, a memory cell array having a hierarchical bit line constitution shown in FIG. 42 was adopted. FIG. 42 shows a case of using an MINP type cell as the memory cell. Multi-divided BL (Bit Line) in FIG. 42 comprises a P-type diffusion layer and one of them is connected by way of a PMOS switching transistor (SHR) to GBL (Global Bit Line) of low resistance. Simultaneously, the other of BL is connected by way of a PMOS switching transistor (PC) to a precharge line (VPC). As a result, as one of advantageous feature of this embodiment, the potential for the non-selected BL is fixed and data holding is stabilized. BL and GBL are arranged in parallel with each other in a planer arrangement and their pitches are identical. In this embodiment, the bit line capacitance can be reduced greatly by setting the number of the memory cells connecting to each BL to 10.

Figure 43:
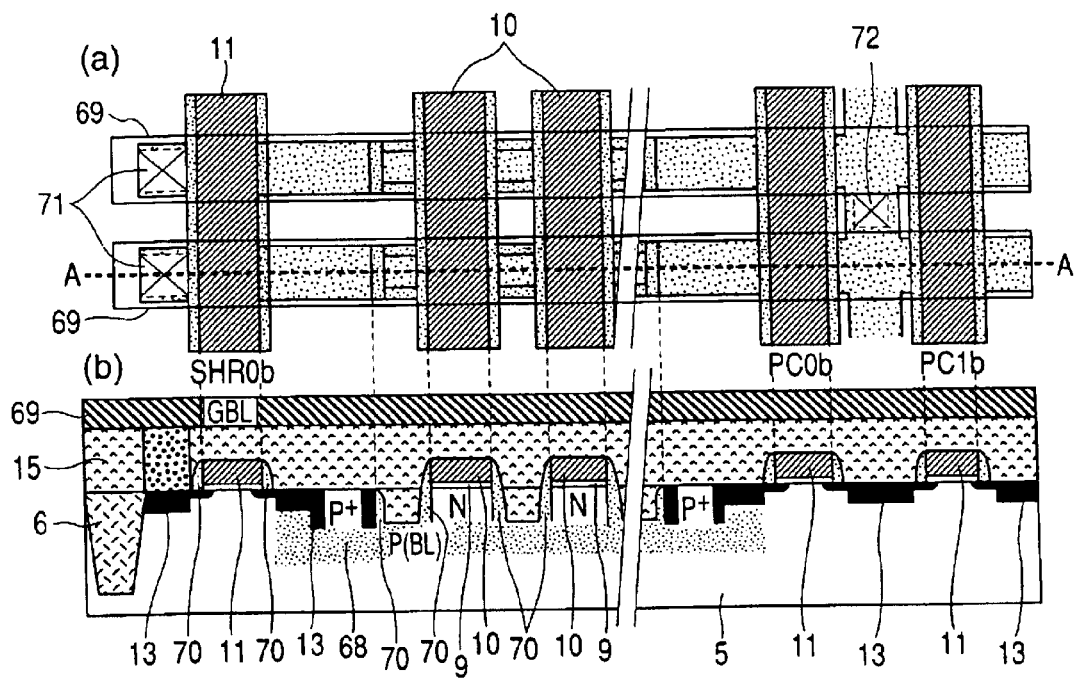
FIG. 43 is a cross sectional view showing an example of a memory cell array system in a semiconductor memory device according to the invention of the present application.

FIG. 43 shows an upper plan view and a cross sectional view of this embodiment. FIG. 43($a$) is an upper plan view and FIG. 43($b$) is a cross sectional view in which each of the regions is shown in correspondingly. FIG. 43($b$) is a cross sectional view taken along A—A in FIG. 43($a$). In the figures, reference numeral 69 denotes a global bit line and a region depicted by reference numeral 71 shown at the inside thereof is a contact region of the global bit line. SHR0b is a region for a selected transistor and PC0b and PC1b are switching transistors of a precharge line. Reference numeral 72 shows a contact region of the precharge line. Further, reference numeral 10 shows a word line. For the cross sectional view, portions identical with those described above are depicted by identical reference numerals. However, reference numeral 69 denotes the global bit line described above and 70 denotes an insulating layer on the side wall.

This invention adopts a structure of connecting the precharge line (VPC) in the diffusion layer and taking appropriate shunt with a view point of reducing the area but, in addition, it may of course be possible to open all contacts to the precharge line (VPC) and connect with the interconnect layer instead of the diffusion layer connection. Further, in this embodiment, the number of cells connecting to each of the bit lines is set to 10 with a primary aim of reducing the bit line capacitance, but it will be apparent that the number of cells connected to each of the bit lines may be increased in a case of intending to further reduce the chip area. Furthermore, while use of the MINP type cell as the memory cell is shown in this embodiment, it will be apparent that an MIPN type of inverted polarity can also be used. In this case, since the BL (Bit Line) comprises an N-type diffusion layer, the switching transistor is NMOS.

<Embodiment 11>

Figure 44:
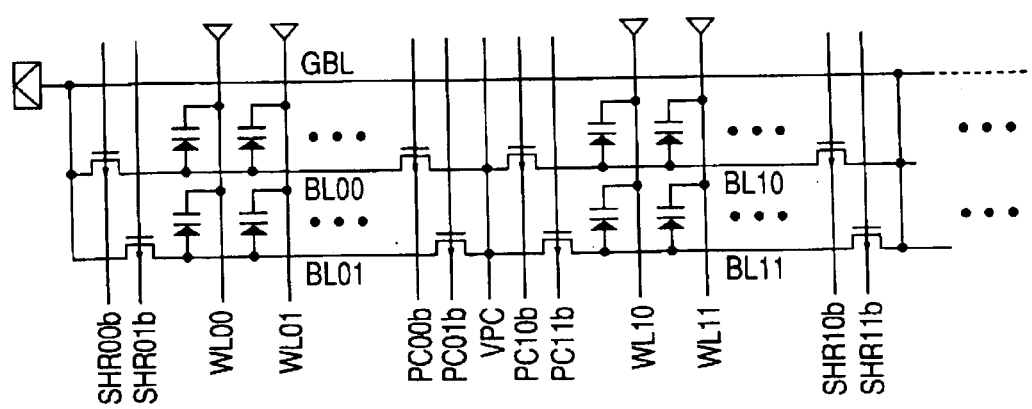
FIG. 44 is a circuit diagram showing an example of a memory cell array system in a semiconductor memory device according to the invention of the present application.
Figure 45:
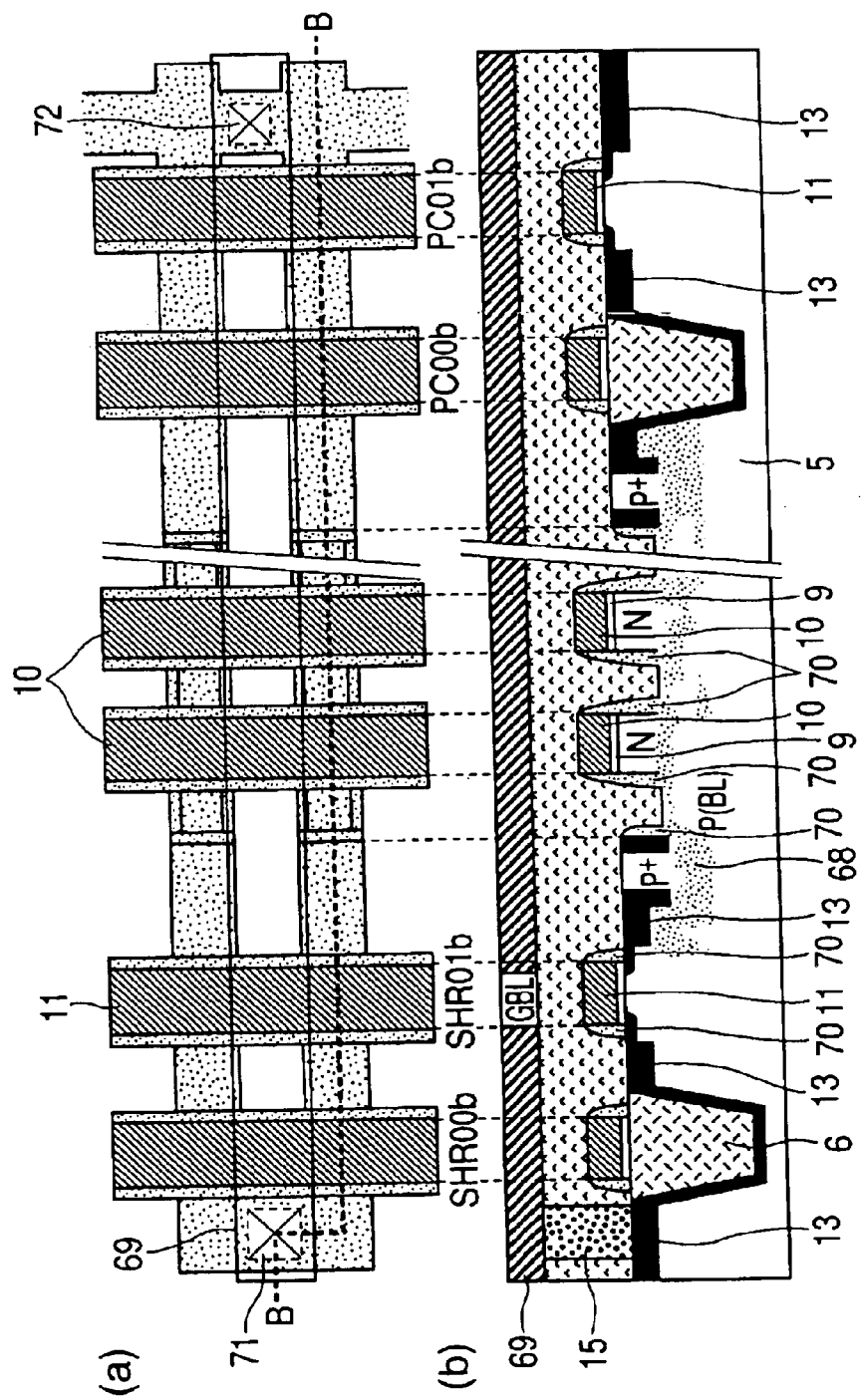
FIG. 45 is a circuit diagram showing an example of a memory cell array system in a semiconductor memory device according to the invention of the present application.

Embodiment 11 discloses an invention of an memory array having a hierarchical bit line constitution described in Embodiment 10, in which the pitch for GBL is made moderate than the pitch for BL to facilitate the production process. FIG. 44 shows a circuit diagram of this embodiment and FIG. 45 shows an upper plan view and a cross sectional view. In FIG. 45, (a) is an upper plan view and (b) is a cross sectional view in which each of the regions is shown correspondingly. FIG. 45($b$) is a cross sectional view taken along line B—B in FIG. 45($a$).

In the figures, reference numeral 69 denotes a global bit line and a region 71 depicted in the inside thereof is a contact region of the global bit line. Reference numeral 72 shows a contact region of a precharge line. SHR00b is a region for a selected transistor and PC00b, PC01b are switching transistors of the recharge line. They correspond to those of the circuit diagram shown in FIG. 44. Further, Reference numeral 10 denotes a word line. In the cross sectional view, the portions identical with those in the previous embodiment are shown by the identical reference numerals. Reference numeral 69 shows a global bit line described above and 70 shows an insulating layer on the side wall.

Like that in Embodiment 10, multi-divided BL comprising a diffusion layer is connected by way of a switching transistor (SHR) to GBL of low resistance and the pitch for GBL is twice the pitch for BL in this embodiment. For enabling this, selected transistors of BL adjacent with each other (for example, SHR00b and SHR01b) are arranged being displaced in the direction of BL. For attaining the structure without moderating the BL pitch, the diffusion layer is connected below the device isolation region as shown in FIG. 45 in view of the process. In this embodiment, use of a MINP type cell as the memory cell is shown but it will be apparent that an inverted polarity type MIPN may also be used. In this case, since the BL (Bit Line) comprises an N-type diffusion layer, the switching transistor is NMOS.

<Embodiment 12>

Figure 46:
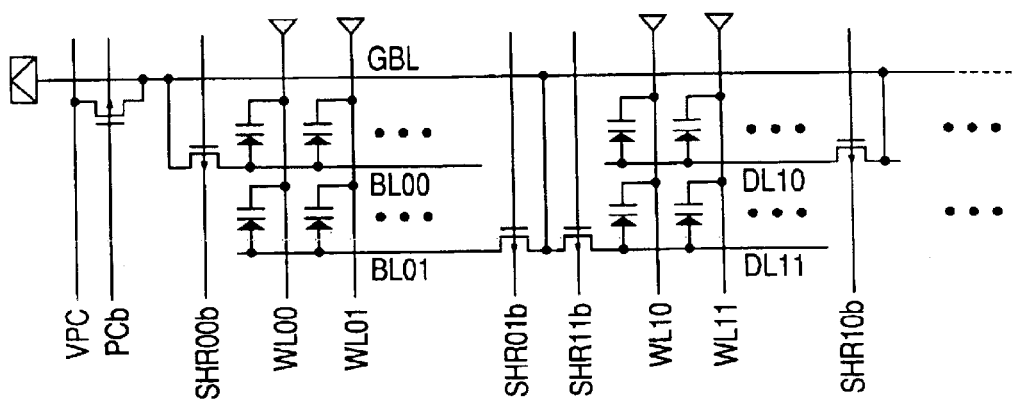
FIG. 46 is a circuit diagram showing an example of a memory cell array system in a semiconductor memory device according to the invention of the present application.
Figure 47:
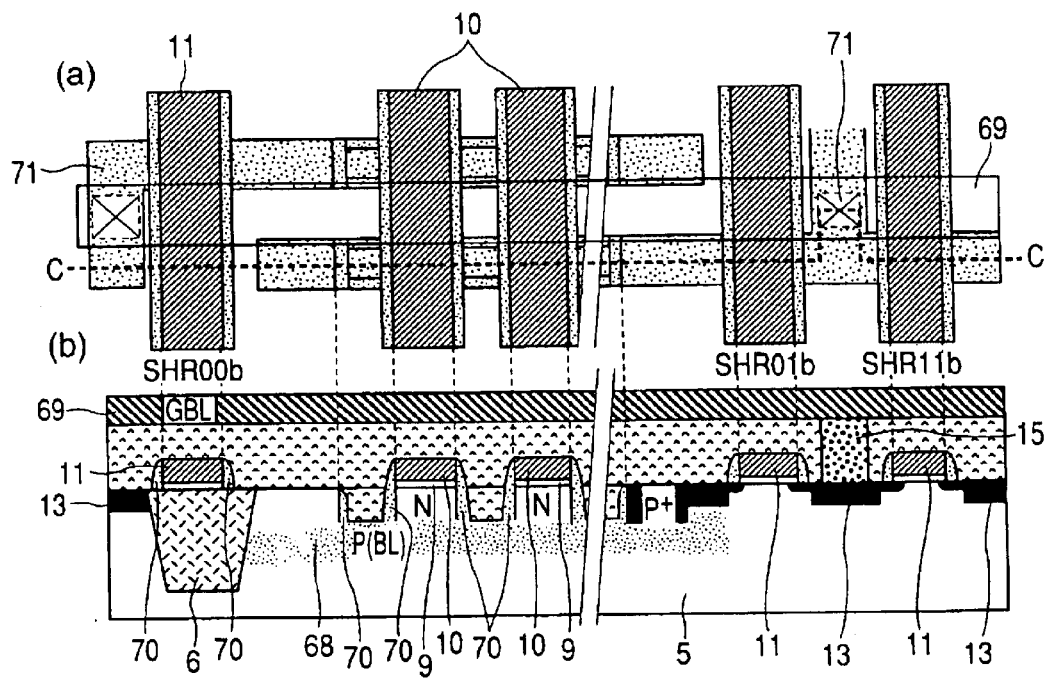
FIG. 47 is an upper plan view showing an example of a memory cell array system in a semiconductor memory device according to the invention of the present application and a cross sectional view along the direction C—C.

Embodiment 12 is an example of a memory array having a hierarchical bit line constitution in which the pitch for the global bit line is moderated which is described in Embodiment 11, wherein the constitution of the peripheral circuit is simplified and reduction of the chip area is enabled. FIG. 46 shows a circuit diagram of this embodiment and FIG. 47 shows an upper plan view and a cross sectional view. FIG. 47($a$) is an upper plan view and FIG. 47($b$) is a cross sectional view, in which each of the regions is shown correspondingly. FIG. 47($b$) is a cross sectional view taken along line C—C in FIG. 47($a$).

In the figures, reference numeral 69 denotes a global bit line and a region 71 is a contact region of the global bit line.

Reference numeral 11 denotes a gate electrode of a peripheral circuit. SHR00b is a selected transistor region and PC00b, PC11b are switching transistors of a precharge line. They are corresponding to those of the circuit diagram shown in FIG. 46. Further, reference numeral 10 denotes a word line. For the cross sectional view, the portions identical with those in the previous embodiments carry the same reference numerals. However, reference numeral 69 denotes the global bit line and 70 denotes the insulating layer on the side wall.

This embodiment has a feature in holding the data of the memory cell connected to the non-selected BL in the floating state. That is, only one of the bit lines BL is connected by way of a switching transistor (SHR) to a global bit line (GBL), which is greatly different from the constitution of FIG. 42 and FIG. 44. As a result, the number of the switching transistors is reduced to one-half to attain the reduction of the chip area. In this embodiment, while use of an MINP type cell as the memory cell is shown, it will be apparent that an inverted polar type MIPN can also be used. In this case, since the BL (Bit Line) comprises an N-type diffusion layer, the switching transistor is NMOS.

While the invention of the present application has been described specifically, since the cell area can be reduced to one-half of that in the existent DRAM, according to the invention of the present application, the chip area can be decreased greatly. Further, since no capacitor is required basically, the height difference with respect to the peripheral circuit can be decreased. In addition, since the number of thermal steps can be decreased drastically compared with the existent case, it does not deteriorate the performance of the peripheral circuit MOSFET (or MISFET) and is extremely suitable to system LSI such as logic embedded DRAM. Further, since the capacitor is no more required, the invention of the present application also has an effect of reducing the number of masks to remarkably simplify the process and decrease the manufacturing cost compared with the existent DRAM. Further, since refreshing is not required, the consumption power is extremely small as well. In addition, since data can be read without destruction, refreshing is not required and the number of sense amplifiers can also be reduced. As the effect, multiple-division of the bit line is possible and the bit line capacitance can be reduced to make cell operation speed higher.

Further, by the use of a retro grade type profile for the impurities constituting the memory cell, micro miniaturization down to the sub 0.1 μm level is possible. This can be said as a scale index in a case of using the bistable diode as a memory cell. Further, the hierarchical bit line structure is essential technique for the improvement of the performance in this memory that utilizes the tunnel phenomenon.

As described above, a semiconductor memory device having a memory capacity of 256 Mbits or more can be attained advantageously according to the invention of the present application.

For easy understanding of the drawings, principal reference numerals are described as below. 1 - - - metal, 2 - - - insulating layer, 3 - - - N-type semiconductor, 4 - - - P-type semiconductor, 5 - - - semiconductor substrate, 6 - - - isolation oxide, 7 - - - N-type well covering memory array, 701 - - - P-type well covering memory array, 8 - - - P-type impurity diffusion layer, 801 - - - N-type impurity diffusion layer, 9, 901, 902 - - - insulating layer, 903 - - - silicon oxide, 904 - - - silicon nitride, 10, 1001 - - - word line, 11, 1101 - - - peripheral circuit gate electrode, 12 - - - resist, 13 - - - impurity diffusion layer of a transistor in peripheral circuit, 14 - - - insulating interlayer, 15 - - - plug, 16 - - - interconnect layer, 17 - - - insulating interlayer, 18 - - - plug, 19 - - - interconnect layer, 20, 2001 - - - silicon nitride, 21 - - - silicon oxide, 50 - - - transistor, 51 - - - capacitor, 60 - - - memory cell array, 61 - - - peripheral circuit, 62 - - - word and bit cross region, 63 - - - capacitor, 64 - - - word line, 65 - - - bit line, 66 - - - memory cell, 67 - - - sense amplifier, 68 - - - sub bit line, 69 - - - global bit line, 70 - - - insulating layer on side wall, 71 - - - contact for global bit line, 72 - - - contact for precharge line, 76 - - - interconnect layer.

In the figures, members depicted by reference numerals each in ( ) show the members corresponding to the reference numerals or those formed in the corresponding steps.

INDUSTRIAL APPLICABILITY

The invention of the present application can provide a semiconductor memory device of high integration density.

What is claimed is:

1. A semiconductor memory device comprising:

a semiconductor substrate;

a memory cell array, disposed on the semiconductor substrate, having plural memory cells, word lines and data lines for selecting the memory cells; and a peripheral circuit disposed on the semiconductor substrate;

wherein each memory cell has a multi-layer of a conductive layer, an insulating layer and plural semiconductor layers containing impurities of different conduction type, and a potential applied to the insulating layer enables movement of carriers through the multi-layer, and at least said plural semiconductor layers are disposed below a surface of said semiconductor substrate.

2. A semiconductor memory device comprising:

a semiconductor substrate;

a memory cell array, disposed on the semiconductor substrate, having plural memory cells, word lines and data lines for selecting the memory cells; and a peripheral circuit disposed on the semiconductor substrate;

wherein each memory cell has a multi-layer of a conductive layer, an insulating layer and plural semiconductor layers containing impurities, the multi-layer of each memory cell has biotable characteristics for a resistance value, a potential applied to the insulating layer enables movement of carriers through the multi-layer, and at least said plural semiconductor layers are disposed below a surface of said semiconductor substrate.

3. A semiconductor memory device comprising:

a semiconductor substrate;

a memory cell array, disposed on the semiconductor substrate, having plural memory cells, word lines and data lines for selecting the memory cells; and a peripheral circuit, disposed on the semiconductor substrate, having plural insulated gate field effect transistors (MISFET) on a periphery of the memory cell array;

wherein each memory cell has a multi-layer of a conductive layer, an insulating layer that enables a tunneling effect, and plural semiconductor layers containing impurities, the plural semiconductor layers are present in the semiconductor substrate, and at least said plural semiconductor layers are disposed below a surface of said semiconductor substrate.

4. A semiconductor memory device as defined in claim 1, wherein the plural semiconductor layers containing impurities have two semiconductor layers of different p-type and n-type conduction.

5. A semiconductor memory device as defined in claim 4, wherein a position of a junction formed by the two semiconductor layers of different p-type and n-type conduction is shallower than the depth of a device isolation region formed in the semiconductor substrate.

6. A semiconductor memory device as defined in claim 4, wherein a position of a PN junction of each memory cell is shallower than the depth of 0.3 µm from the surface of the semiconductor substrate.

7. A semiconductor memory device as defined in claim 4, wherein at least one of the plural semiconductor layers has an impurity concentration that is higher inside of the semiconductor substrate than on the surface of the semiconductor substrate.

8. A semiconductor memory device as defined in claim 4, wherein an impurity concentration of a layer present in contact with the surface of the semiconductor substrate of the plural semiconductor layers is $1 \times 10^{17}$ cm$^{-3}$ or less on the surface of the semiconductor substrate.

9. A semiconductor memory device as defined in claim 4, wherein a maximum impurity concentration of a layer in contact with the surface of the semiconductor substrate of the plural semiconductor layers is $1 \times 10^{17}$ cm$^{-3}$ or more.

10. A semiconductor memory device as defined in claim 4, wherein a maximum impurity concentration of a layer present inside of the semiconductor substrate of the plural semiconductor layers is $1 \times 10^{17}$ cm$^3$ or more.

11. A semiconductor memory device as defined claim 4, wherein a position of a PN junction of each memory cell is at a place deeper than a position at which an impurity concentration is maximum of a layer present in contact with the surface of the semiconductor substrate of the plural semiconductor layers.

12. A semiconductor memory device as defined in claim 1, wherein the plural semiconductor layers comprises two p-type layers with an n-type layer therebetween, or two n-type layers with a p-type layer therebetween.

13. A semiconductor memory device according to claim 5 wherein the plural semiconductor layers include a p-type third layer arranged to form an additional junction positioned shallower than the depth of the device isolation region.

14. A semiconductor memory device as defined in claim 3, wherein the conductive layer of the memory cell is formed as part of a same conductive layer as a gate electrode of an insulated gate field effect transistor in the peripheral circuit.

15. A semiconductor memory device as defined in claim 3, wherein the conductive layer of the memory cell comprises a multi-layer containing n-type or p-type polycrystalline silicon.

16. A semiconductor memory device as defined in claim 3, wherein the insulating layer of the memory cell is an insulating layer connected with an insulating layer of an insulated gate field effect transistor in the peripheral circuit.

17. A semiconductor memory device as defined in claim 1, wherein the insulating layer of the memory cell is a multi-layer of insulating layers having different band gape.

18. A semiconductor memory device as defined in claim 17, wherein the insulating layer of the memory cell comprises a multi-layer of a silicon oxide layer and a silicon nitride layer and the silicon oxide layer is in contact with a p-type semiconductor layer formed in a silicon substrate.

19. A semiconductor memory device as defined in claim 1, wherein at least one of the plural semiconductor layers is extending in a direction perpendicular to the word lines in the semiconductor substrate.

20. A semiconductor memory device as defined in claim 1, wherein a respective one of the plural semiconductor layers in contact with the insulating layer in each memory cell is separated from the corresponding semiconductor layer of the other memory cells.

21. A semiconductor memory device as defined in claim 1, wherein a conductive plug is electrically connected to a layer formed in a lowest portion of the plural semiconductor layers.

22. A semiconductor memory device as defined in claim 1, wherein a layer formed at a lowest portion of the plural semiconductor layers is electrically connected with a conductive layer extending in directions perpendicular to the word lines in the planar arrangement.

23. A semiconductor memory device as defined in claim 1, wherein a layer extending in a direction perpendicular to the word lines in the same plane as the plural semiconductor layers is electrically connect with a diffusion layer of a first insulated gate field effect transistor formed in the semiconductor substrate and is connected electrically with the conductive layer that also extends in the direction perpendicular of the word lines.

24. A semiconductor memory device including plural memory arrays each comprising:

plural word lines;

plural data lines arranged so as to intersect the plural word lines in a planer arrangement;

plural memory cells which are disposed each at a desired intersection between the plural word lines and the plural data lines and each connected to the corresponding word line and corresponding data line;

a common data line disposed is common with the plural data lines; and plural signal transmission means having a switching function for connecting the common data line to the plural data lines respectively;

wherein each memory cell has a multi-layer of a conductive layer, an insulating layer and plural semiconductor layers containing impurities, a potential applied to the insulating layer enables movement of the carriers by way of the multi-layer, and at least said plural semiconductor layers are disposed below a surface of a semiconductor substrate.

25. A semiconductor memory device including plural memory arrays each comprising:

plural word lines;

plural data lines arranged so as to intersect the plural word lines in a planar arrangement;

plural memory cells which are disposed each at a desired intersection between the plural word lines and the plural data lines and each connected to the corresponding word line and corresponding data line, a common data line disposed in common with the plural data lines; and plural signal transmission means having a switching function for connecting the common data line to the plural data lines respectively;

wherein the memory cell has a multi-layer of a conductive layer, an insulating layer and plural semiconductor layers containing impurities, the multi-layer of the memory cell has a bistable characteristic of a resistance value, a potential applied to the insulating layer enables movement of carriers through the multi-layer, and at least said plural semiconductor layers are disposed below a surface of a semiconductor substrate.

26. A semiconductor memory device including plural memory arrays each comprising:

plural word lines;

plural data lines arranged so as to intersect the plural word lines in a planer arrangement;

plural memory cells which are disposed each at a desired intersection between the plural word lines and the plural data lines and each connected to the corresponding word line and corresponding data line;

a common data line disposed in common with the plural data lines; and plural signal transmission means having a switching function for connecting the common data line to the plural data lines respectively;

wherein a memory cell has a multi-layer of a conductive layer, an insulating layer enabling a tunnel affect and plural semiconductor layers containing impurities, the plural semiconductor layers containing the impurities are below a surface of a semiconductor substrate and a potential applied to the insulating layer enables movement of carriers through the multi-layer.

27. A semiconductor memory device as defined in claim 1, wherein at least each memory cell is formed on an On SOI substrate.

28. A semiconductor memory device as defined in claim 1, wherein plural bit lines have one sense amplifier in common in a memory cell array region.

29. A semiconductor memory device as defined in claim 1, wherein at least a portion of the memory device is disposed in the semiconductor substrate and a memory capacity is 256 Mbits or more;

a step of depositing an interlayer insulating layer, then opening a contact hole and burying a conductive body into the contact; and a step of forming a bit line in the memory cell array region and a local interconnect layer in the peripheral circuit region.

30. A semiconductor memory device comprising:

a semiconductor substrate;

a memory cell array, disposed on the semiconductor substrate, having plural memory cells, word lines and data lines for selecting the memory cells; and a peripheral circuit disposed on the semiconductor substrate;

wherein each memory cell has multi-layer of a conductive layer, an insulating layer and plural semiconductor layers containing impurities, a current that flows when a potential is applied to the insulating layer is capable of moving carriers by way of a multi-layer and has a hysteresis characteristic relative to the applied voltage, and at least said plural semiconductor layers are disposed below a surface of the semiconductor substrate.

31. A semiconductor memory device as defined in claim 5, wherein an impurity concentration of a layer present in contact with the surface of the semiconductor substrate of the plural semiconductor layers is $1 \times 10^{17}$ cm$^{-3}$ or less on the surface of the semiconductor substrate.

32. A semiconductor memory device as defined in claim 6, wherein an impurity concentration of a layer present in contact with the surface of the semiconductor substrate of the plural semiconductor layers is $1 \times 10^{17}$ cm$^{-3}$ or less on the surface of the semiconductor substrate.

33. A semiconductor memory device as defined in claim 7, wherein an impurity concentration of a layer present in contact with the surface of the semiconductor substrate of the plural semiconductor layers is $1 \times 10^{17}$ cm$^{-3}$ or less on the surface of the semiconductor substrate.

* * * * *